(12) United States Patent
Uchida et al.

(10) Patent No.: US 11,296,245 B2
(45) Date of Patent: Apr. 5, 2022

(54) IMAGE CAPTURING APPARATUS INCLUDING A COMPOUND SEMICONDUCTOR LAYER

(71) Applicant: Sony Corporation, Tokyo (JP)

(72) Inventors: Shiro Uchida, Tokyo (JP); Hideshi Abe, Kanagawa (JP); Tomomasa Watanabe, Kanagawa (JP); Hiroshi Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 16/711,084

(22) Filed: Dec. 11, 2019

(65) Prior Publication Data

US 2020/0119210 A1 Apr. 16, 2020

Related U.S. Application Data

(63) Continuation of application No. 14/609,601, filed on Jan. 30, 2015, now abandoned.

(30) Foreign Application Priority Data

Feb. 7, 2014 (JP) .................................. 2014-022155

(51) Int. Cl.
*H01L 31/02* (2006.01)
*H01L 31/0224* (2006.01)
(Continued)

(52) U.S. Cl.
CPC .. *H01L 31/022475* (2013.01); *H01L 27/1443* (2013.01); *H01L 27/1446* (2013.01);
(Continued)

(58) Field of Classification Search
CPC ......... H01L 31/022475; H01L 27/1443; H01L 27/1446; H01L 27/14634;
(Continued)

(56) References Cited

U.S. PATENT DOCUMENTS 4,608,586 A 8/1986 Kim
5,684,308 A 11/1997 Lovejoy et al.
(Continued)

FOREIGN PATENT DOCUMENTS

JP 03-104287 5/1991
JP 04-207086 7/1992
(Continued)

OTHER PUBLICATIONS

W. Chang et al., "Opto-electronic properties of chromium doped indium-tin-oxide films deposited at room temperature", Mater. Sci. Eng., B, 153 (1) (2008), pp. 57-61.
(Continued)

*Primary Examiner* — Nduka E Ojeh
*Assistant Examiner* — Laura M Dykes
(74) *Attorney, Agent, or Firm* — K&L Gates LLP

(57) ABSTRACT

A light receiving element includes a surface recombination prevention layer composed of a first compound semiconductor on which light is incident; a photoelectric conversion layer composed of a second compound semiconductor; and a compound semiconductor layer composed of a third compound semiconductor, the surface recombination prevention layer having a thickness of 30 nm or less. Also, there are provided an image capturing element including the light receiving element, and an image capturing apparatus including the image capturing element.

10 Claims, 13 Drawing Sheets

(51) Int. Cl.
*H01L 31/105* (2006.01)
*H01L 27/144* (2006.01)
*H01L 27/146* (2006.01)

(52) U.S. Cl.
CPC ............. *H01L 27/14634* (2013.01); *H01L 31/022466* (2013.01); *H01L 31/105* (2013.01); H01L 27/1462 (2013.01); H01L 27/14627 (2013.01); H01L 27/14694 (2013.01)

(58) Field of Classification Search
CPC ........... H01L 31/022466; H01L 31/105; H01L 27/1462; H01L 27/14627; H01L 27/14694
USPC ........................................................ 257/432
See application file for complete search history.

(56) References Cited

U.S. PATENT DOCUMENTS

| | | | |
|---|---|---|---|
| 5,726,462 | A | 3/1998 | Spahn et al. |
| 5,780,867 | A | 7/1998 | Fritz et al. |
| 8,299,497 | B1 | 10/2012 | Klem et al. |
| 2002/0000510 | A1* | 1/2002 | Matsuda ............... H01L 31/105 250/214.1 |
| 2002/0050592 | A1 | 5/2002 | Kakinuma |
| 2003/0218153 | A1 | 11/2003 | Abe |
| 2004/0137280 | A1 | 7/2004 | Abe et al. |
| 2005/0012095 | A1 | 1/2005 | Niira et al. |
| 2009/0165840 | A1 | 7/2009 | Murata et al. |
| 2009/0184383 | A1 | 7/2009 | Seeds et al. |
| 2009/0278158 | A1 | 11/2009 | Fukunaga et al. |
| 2010/0155777 | A1 | 6/2010 | Hill et al. |
| 2010/0182800 | A1 | 7/2010 | Taniguchi et al. |
| 2010/0275990 | A1 | 11/2010 | Shimomura et al. |
| 2011/0205412 | A1* | 8/2011 | Miyazaki .......... H01L 27/14623 348/294 |
| 2014/0026952 | A1 | 1/2014 | Kim et al. |
| 2015/0155320 | A1 | 6/2015 | Chien et al. |

FOREIGN PATENT DOCUMENTS

| | | |
|---|---|---|
| JP | 06-232382 | 8/1994 |
| JP | H09331058 | 12/1997 |
| JP | 2010294478 A | 11/1998 |
| JP | 2001-332758 | 11/2001 |
| JP | 2002-050786 | 2/2002 |
| JP | 2003-188405 | 7/2003 |
| JP | 2005347475 A | 12/2005 |
| JP | 2006019360 A | 1/2006 |
| JP | 2006-0179695 | 7/2006 |
| JP | 2007-158129 | 6/2007 |
| JP | 2007-266251 | 10/2007 |
| JP | 2009-065141 | 3/2009 |
| JP | 2009-099907 | 5/2009 |
| JP | 2009-532852 | 9/2009 |
| JP | 2010205858 A | 9/2010 |
| JP | 2013-016799 | 1/2013 |
| JP | 2013-175686 | 9/2013 |
| WO | 00/63973 | 10/2000 |
| WO | 2011/148574 | 1/2011 |

OTHER PUBLICATIONS

Venkatesan, M. et al., "Room temperature ferromagnetism in Mn- and Fe-doped indium tin oxide thin films", J. Appl. Phys., 2008, 103 (7), 07D135.

T. Ohno et al., "Magnetic and electric properties of Fe-doped ITO thin films", J. Magn. Mater., 310 (2007), pp. 717-719.

* cited by examiner

| 101 | 101 | 101 | 101 |
|---|---|---|---|
| 101 | 101 | 101 | 101 |
| 101 | 101 | 101 | 101 |
| 101 | 101 | 101 | 101 |

FIG.9A

| 101W | 102 | 101W | 101 |
|---|---|---|---|
| 101W | 101 | 101W | 101 |
| 101W | 101 | 101W | 101 |
| 101W | 101 | 101W | 101 |

FIG.9B

| 101R | 101B | 101R | 101B |
|------|------|------|------|
| 101G | 102  | 101G | 102  |
| 101R | 101B | 101R | 101B |
| 101G | 102  | 101G | 102  |

FIG.10

IMAGE CAPTURING APPARATUS INCLUDING A COMPOUND SEMICONDUCTOR LAYER

CROSS REFERENCES TO RELATED APPLICATIONS

The present application is a continuation of U.S. application Ser. No. 14/609,601, filed on Jan. 30, 2015, which application claims priority to Japanese Priority Patent Application JP 2014-022155 filed in the Japan Patent Office on Feb. 7, 2014, the entire content of which is hereby incorporated by reference.

BACKGROUND

The present disclosure relates to a light receiving element, an image capturing element including the light receiving element, and an image capturing apparatus including the image capturing element.

In general, an image capturing element included in an image capturing apparatus includes a light receiving element (photoelectric conversion element, photodiode) formed on a silicon semiconductor substrate. Once a wavelength of incident light is determined, an light absorption index of silicon (Si) is unambiguously determined. Accordingly, in order to effectively absorb light, in particular, red light to near infrared region light, by the silicon semiconductor substrate, a light receiving element should be formed on the silicon semiconductor substrate positioned deeper from a light incident surface (specifically, about 10 m, for example) (see Japanese Patent Application Laid-open No. 09-331058, for example). This means that an aspect ratio in the image capturing element increases as pixels are miniaturized in the image capturing apparatus.

SUMMARY

When the aspect ratio increases in the image capturing element, it arises a problem of a color mixture between pixels where light incident on a certain image capturing element is incident on other image capturing element adjacent thereto. If the aspect ratio in the image capturing element is decreased in order to decrease the color mixture between pixels, a sensitivity of the image capturing element is undesirably decreased in red color to near infrared region light. In addition, as an energy band gap of Si is 1.1 eV, it is theoretically impossible to detect infrared light longer than 1.1 µm. Instead of Si, InGaAs is used, thereby being possible to detect infrared light. However, if an InP substrate is not removed, visible light is impossible to be detected.

In view of the circumstances as described above, there is a need for providing a light receiving element, an image capturing element including the light receiving element, and an image capturing apparatus including the image capturing element having high sensitivity from a visible region to an infrared region.

According to a first feature of the present disclosure, there is provided a light receiving element, including:
a surface recombination prevention layer composed of a first compound semiconductor on which light is incident;
a photoelectric conversion layer composed of a second compound semiconductor; and
a compound semiconductor layer composed of a third compound semiconductor, the surface recombination prevention layer having a thickness of 30 nm or less.

According to a second feature of the present disclosure, there is provided a light receiving element, including:
a transparent conductive material layer on which light is incident;
a surface recombination prevention layer composed of a first compound semiconductor;
a photoelectric conversion layer composed of a second compound semiconductor; and
a compound semiconductor layer composed of a third compound semiconductor, further including:
a contact layer composed of a fourth compound semiconductor formed between the transparent conductive material layer and the surface recombination prevention layer, the surface recombination prevention layer having a thickness of 30 nm or less, and the contact layer having a thickness of 20 nm or less.

According to a first feature of the present disclosure, there is provided an image capturing element including a light receiving element and a filter for passing light having a desirable wavelength disposed at a light incident side of the light receiving element, in which the light receiving element includes
a surface recombination prevention layer composed of a first compound semiconductor on which light is incident;
a photoelectric conversion layer composed of a second compound semiconductor; and
a compound semiconductor layer composed of a third compound semiconductor, the surface recombination prevention layer having a thickness of 30 nm or less. In other words, the light receiving element in the image capturing element according to the first feature of the present disclosure is composed of the light receiving element according to the first feature of the present disclosure.

According to a second feature of the present disclosure, there is provided an image capturing element including a light receiving element and a filter for passing light having a desirable wavelength disposed at a light incident side of the light receiving element, in which the light receiving element includes
a transparent conductive material layer on which light is incident;
a surface recombination prevention layer composed of a first compound semiconductor;
a photoelectric conversion layer composed of a second compound semiconductor; and
a compound semiconductor layer composed of a third compound semiconductor, further including:
a contact layer composed of a fourth compound semiconductor formed between the transparent conductive material layer and the surface recombination prevention layer, the surface recombination prevention layer having a thickness of 30 nm or less, and the contact layer having a thickness of 20 nm or less. In other words, the light receiving element in the image capturing element according to the second feature of the present disclosure is composed of the light receiving element according to the second feature of the present disclosure.

According to a first feature of the present disclosure, there is provided an image capturing apparatus, including:
a plurality of image capturing elements including light receiving elements and filters for passing light having a desirable wavelength disposed at light incident sides of the light receiving elements, in which the light receiving element includes
a surface recombination prevention layer composed of a first compound semiconductor on which light is incident;

a photoelectric conversion layer composed of a second compound semiconductor; and a compound semiconductor layer composed of a third compound semiconductor, the surface recombination prevention layer having a thickness of 30 nm or less. In other words, the light receiving element in the image capturing apparatus according to the first feature of the present disclosure is composed of the light receiving element according to the first feature of the present disclosure.

According to a second feature of the present disclosure, there is provided an image capturing apparatus, including:

a plurality of image capturing elements including light receiving elements and filters for passing light having a desirable wavelength disposed at light incident sides of the light receiving elements, in which the light receiving element includes a transparent conductive material layer on which light is incident;

a surface recombination prevention layer composed of a first compound semiconductor;

a photoelectric conversion layer composed of a second compound semiconductor; and a compound semiconductor layer composed of a third compound semiconductor, further including:

a contact layer composed of a fourth compound semiconductor formed between the transparent conductive material layer and the surface recombination prevention layer, the surface recombination prevention layer having a thickness of 30 nm or less, and the contact layer having a thickness of 20 nm or less. In other words, the light receiving element in the image capturing element according to the second feature of the present disclosure is composed of the light receiving element according to the second feature of the present disclosure.

As the surface recombination prevention layer and the contact layer have the thicknesses thinner than predetermined thicknesses in the light receiving element, the image capturing element and the image capturing apparatus according to the first and second features of the present disclosure, visible light and infrared light pass through the surface recombination prevention layer, thereby providing the light receiving element having a high sensitivity from visible region to an infrared region. In the light receiving element, the image capturing element and the image capturing apparatus according to the second feature of the present disclosure, the contact layer is included such that contact resistance can be decreased.

The advantages described herein are provided for purposes of illustration only, and merely depict typical embodiments of the present disclosure, and the scope of the present disclosure should not be construed narrower.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIGS. 9A and 9B each is a diagram schematically showing the image capturing element unit in the image capturing apparatus in the third embodiment;

FIG. 10 is a diagram schematically showing the image capturing element unit in the image capturing apparatus in the third embodiment;

DETAILED DESCRIPTION

Figure 1A:
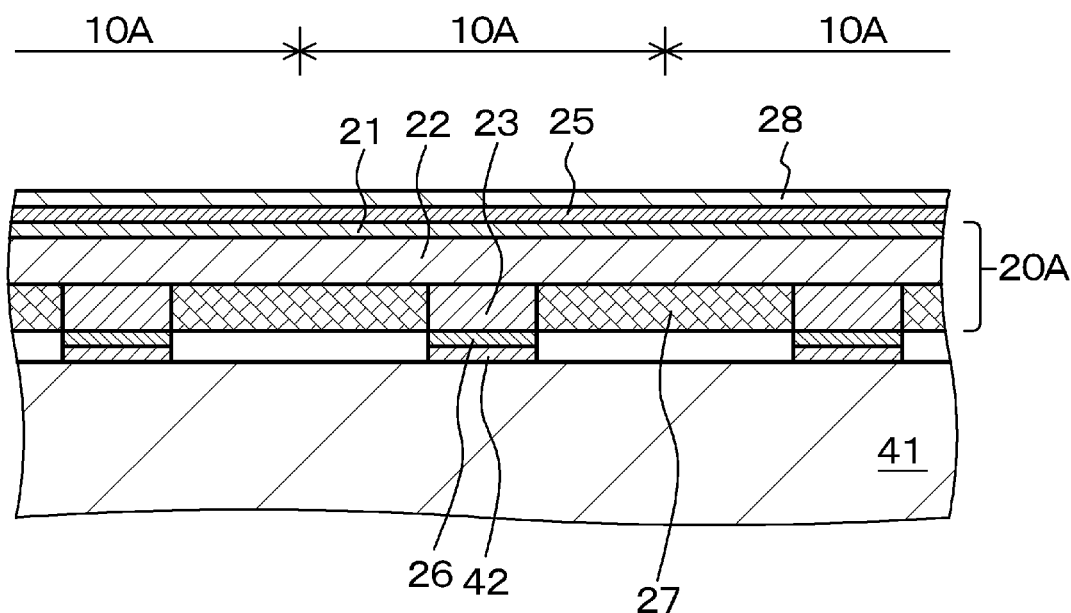
FIGS. 1A and 1B are schematic partial sectional diagrams of light receiving elements according to first and second embodiments.

Hereinafter, an embodiment of the present disclosure will be described with reference to the drawings.

The embodiments of the present disclosure will be described in the following order.
1. General description about light receiving element, image capturing element and image capturing apparatus according to first and second features of the present disclosure
2. First embodiment (light receiving element according to first feature of the present disclosure)
3. Second embodiment (light receiving element according to second feature of the present disclosure)
4. Third embodiment (image capturing element and image capturing apparatus according to first and second features of the present disclosure)
5. Fourth embodiment (alternative embodiment of first to third embodiments, alternative embodiment of transparent conductive material layer)
6. Fifth embodiment (alternative embodiment of fourth embodiment), others

[General Description about Light Receiving Element, Image Capturing Element and Image Capturing Apparatus According to First and Second Features of the Present Disclosure]

In a light receiving element according to a first feature of the present disclosure, a light receiving element of an image capturing element according to a first feature of the present disclosure and a light receiving element of an image capturing apparatus according to a first feature of the present disclosure (hereinafter collectively referred to as "light receiving elements according to a first feature of the present disclosure"), the surface recombination prevention layer comprises InP, InGaAsP or AlInAs; the photoelectric conversion layer comprises InGaAs; and the compound semiconductor layer comprises InP, InGaAsP or AlInAs.

In the light receiving elements according to a first feature of the present disclosure including the above-described desirable embodiments, the first compound semiconductor is an n type compound semiconductor, the second compound semiconductor is an i type compound semiconductor, and the third compound semiconductor is a p type compound semiconductor.

In the light receiving elements according to a first feature of the present disclosure, when a band gap of the first compound semiconductor is represented by $BG_1$, a band gap of the second compound semiconductor is represented by $BG_2$, and a band gap of the third compound semiconductor is represented by $BG_3$, the $BG_1$, $BG_2$ and $BG_3$ satisfy $BG_1 > BG_2$ and $BG_3 > BG_2$.

In the light receiving elements according to the first feature of the present disclosure including the above-described various desirable embodiments, a transparent conductive material layer can be formed at a light incident surface of the surface recombination prevention layer. In this case, the transparent conductive material layer can comprise ITO, ITiO or NiO. A conductive type of the material for the transparent conductive material layer is desirably the same as the compound semiconductor of the surface recombination prevention layer.

In a light receiving element according to a second feature of the present disclosure, a light receiving element of an image capturing element according to a second feature of the present disclosure and a light receiving element of an image capturing apparatus according to a second feature of the present disclosure (hereinafter collectively referred to as "light receiving elements according to a second feature of the present disclosure"), the contact layer comprises InGaAs, InP or InGaAsP; the surface recombination prevention layer comprises InP, InGaAsP or AlInAs; the photoelectric conversion layer comprises InGaAs; and the compound semiconductor layer comprises InGaAs, InP or InGaAsP. In this case, a combination of (the compound semiconductor of the contact layer and the compound semiconductor of the surface recombination prevention layer) can include (InGaAs, InP), (InGaAs, InGaAsP), (InGaAs, AlInAs), (InP, InGaAsP), (InP, AlInAs), (InGaAsP, InP), (InGaAsP, AlInAs) or (In$_X$GaAsP, In$_Y$GaAsP)[where X>Y]. Furthermore, in this case, the first compound semiconductor is an n type compound semiconductor, the second compound semiconductor is an i type compound semiconductor, the third compound semiconductor is a p type compound semiconductor, and the fourth compound semiconductor is an n$^+$ type compound semiconductor.

In the light receiving elements according to a second feature of the present disclosure, when a band gap of the first compound semiconductor is represented by $BG_1$, a band gap of the second compound semiconductor is represented by $BG_2$, a band gap of the third compound semiconductor is represented by $BG_3$, a band gap of the fourth compound semiconductor is represented by $BG_4$, $BG_1$, $BG_2$, $BG_3$ and $BG_4$ satisfy $BG_1 > BG_2$, $BG_3 > BG_2$ and $BG_1 > BG_4$. In the light receiving elements according to a second feature of the present disclosure including the above-described various desirable embodiments, the transparent conductive material layer can comprise ITO, ITiO or NiO. A conductive type of the material for the transparent conductive material layer is desirably the same as the compound semiconductor of the contact layer.

In the light receiving elements according to first and second features of the present disclosure including the above-described various desirable embodiments and structures, a supplemental electrode can be formed on a light incident layer of the transparent conductive material layer. The supplemental electrode can have a planar shape of a lattice pattern (a grid pattern). Alternatively, a plurality of branch supplemental electrodes may be extended in parallel each other and respective one ends or both ends in a plurality of branch supplemental electrodes may be connected each other. The supplemental electrode can be composed of an AuGe layer/Ni layer/Au layer, Mo layer/Ti layer/Pt layer/Au layer, Ti layer/Pt layer/Au layer, Ni layer/Au layer and can be formed by a physical vapor deposition method (PVD method) such as a sputtering method and a vacuum evaporation method. It is noted that the layer at the very front separated by "/" is disposed at a transparent conductive material layer side.

Also, an antireflection film can be formed on the light incident layer of the transparent conductive material layer. The antireflection film is desirably formed of the material having a refractive index smaller than that of the compound semiconductor of the uppermost compound semiconductor layer. Specifically, a layer including $TiO_2$, $Al_2O_3$, ZnS, $MgF_2$, $Ta_2O_5$, $SiO_2$, $Si_3N_4$ or $ZrO_2$ or a laminated structure thereof may be used, which can be formed by the PVD method such as the sputtering method.

In the light receiving elements according to first and second features of the present disclosure including the above-described various desirable embodiments, the transparent conductive material layer has a first surface in contact with the surface recombination prevention layer or the contact layer and a second surface facing to the first surface, and comprises the transparent conductive material. The transparent conductive material contains an additive composed of at least one metal selected from the group consisting of molybdenum, tungsten, chromium, ruthenium, titanium, nickel, zinc, iron and copper or a compound thereof. A concentration of the additive contained in the transparent conductive material near an interface of the first surface of the transparent conductive material layer is higher than a concentration of the additive contained in the transparent conductive material near an interface of the second surface of the transparent conductive material layer. Examples of the additive composed of the metal compound contained in the transparent conductive material layer include tungsten oxide, chromium oxide, ruthenium oxide, titanium oxide, nickel oxide, zinc oxide, iron oxide and copper oxide.

In this manner, when the transparent conductive material layer contains the additive and the concentration of the additive contained in the transparent conductive material near an interface of the first surface of the transparent conductive material layer is higher than the concentration of the additive contained in the transparent conductive material near an interface of the second surface of the transparent conductive material layer, the transparent conductive material layer satisfying both a low contact resistance value and a high light transmittance can be provided.

As described above, the concentration of the additive contained in the transparent conductive material near an interface of the first surface of the transparent conductive material layer is higher than the concentration of the additive contained in the transparent conductive material near an interface of the second surface of the transparent conductive material layer. Herein, the near interface of the first surface of the transparent conductive material layer means an area that occupies 10% of a thickness of the transparent conductive material layer from the first surface of the transparent conductive material layer to the second surface of the transparent conductive material layer. The near interface of the second surface of the transparent conductive material layer means an area that occupies 10% of the thickness of the transparent conductive material layer from the second surface of the transparent conductive material layer to the first surface of the transparent conductive material layer. The concentration of the additive means an average concentration in these areas.

Alternatively, the transparent conductive material layer may have a laminated structure of a first layer and a second layer from a surface recombination prevention layer side or a contact layer side. While the transparent conductive material of the first layer contains an additive, the transparent conductive material of the second layer contains no additive. Such a configuration is called as a "transparent conductive material layer having a first configuration" for the sake of simplicity. When the average concentration of the additive contained in the transparent conductive material of the first layer is represented by $Ic_1$ and the average concentration of the additive contained in the transparent conductive material of the second layer is represented by $Ic_2$, it is desirable that $5 \leq Ic_1/Ic_2 \leq 10$ is satisfied. SIMS is used to determine whether or not the additive is contained in the transparent conductive material. Here, when a carrier concentration of one metal (specifically, molybdenum) is $1.8 \times 10^{16}$ cm$^{-3}$ or more, it can be determined that the additive is contained in the transparent conductive material. On the other hand, when the carrier concentration of one metal (specifically, molybdenum) is less than $1.8 \times 10^{16}$ cm$^{-3}$, it can be determined that the additive is contained in the transparent conductive material.

The average concentration of the additive contained in the transparent conductive material of the first layer is desirably $5 \times 10^{16}$ cm$^{-3}$ to $1 \times 10^{18}$ cm$^{-3}$. In the transparent conductive material layer having the first configuration including the desirable configuration, when electrical resistivity of the first layer is represented by $R_1$, electrical resistivity of the second layer is represented by $R_2$, light transmittance of the first layer is represented by $TP_1$ within a wavelength range of 400 nm to 900 nm, and light transmittance of the first layer is represented by $TP_2$ within a wavelength range of 400 nm to 900 nm, it is desirable that $0.4 \leq R_2/R_1 \leq 1.0$ and $0.80 \leq TP_2 \times TP_1 \leq 1.0$ are satisfied. Furthermore, in the transparent conductive material layer having the first configuration including the desirable configuration, it is desirable that average light transmittance of the transparent conductive material layer is 95% or more, average electrical resistivity of the transparent conductive material layer is $2 \times 10^{-6}$ Ω·m ($2 \times 10^{-4}$ Ω·cm) or less, and a contact resistance value between the transparent conductive material layer and the surface recombination prevention layer or the contact layer is $1 \times 10^{-8}$ Ω·m$^2$ ($1 \times 10^{-4}$ Ω·cm$^2$) or less. When a thickness of the first layer is represented by $T_1$ and a thickness of the second layer is represented by $T_2$, it is desirable that $2 \leq T_2/T_1 \leq 70$ is satisfied. In this case, it is more desirable that $3 \leq T_1$ (nm) $\leq 60$ and $10 \leq T_2$ (nm) $\leq 350$ are satisfied. Here, SIMS can be used to determine the average concentration of the additive contained in the first layer of the transparent conductive material. The electrical resistivity of the first layer, the electrical resistivity of the second layer and the average electrical resistivity of the transparent conductive material layer can be measured as follows: after the surface of the light receiving element is adhered to the support substrate such as a glass substrate and a rear surface of the light receiving element is peeled, a remaining transparent conductive material layer is measured using a Hall measurement or a sheet resistance measurement machine. A contact resistance value between the transparent conductive material layer and the contact layer can be measured as follows: when the surface of the light receiving element is adhered to the support substrate such as a glass substrate and a rear surface of the light receiving element is peeled, only the contact layer is left behind and a TLM pattern is formed. Thereafter a four-terminal method is used for measurement. Furthermore, the light transmittance (light absorption index) of the first layer, the light transmittance (light absorption index) of the second layer and the average light transmittance (light absorption index) of the transparent conductive material layer can be measured by adhering them to the glass substrate using a transmission and reflectivity measuring instrument. The thickness of the first layer and the thickness of the second layer can be measured by a step profiler or SEM or TEM electron microscope observation.

Alternatively, the concentration of the additive contained in the transparent conductive material of the transparent conductive material layer can be gradually decreased from the first surface to the second surface of the transparent conductive material layer. Such a configuration is called as a "transparent conductive material layer having a second configuration". The concentration of the additive contained in the transparent conductive material can be measured using SIMS.

Examples of the transparent conductive material include ITO (indium tin oxide, including Sn doped $In_2O_3$, crystalline ITO and amorphous ITO), IZO (Indium Zinc Oxide), AZO (aluminum oxide doped zinc oxide), GZO (gallium doped zinc oxide), AlMgZnO (aluminum oxide and magnesium oxide doped zinc oxide), indium-gallium complex oxide (IGO), In—GaZnO$_4$ (IGZO), IFO (F doped $In_2O_3$), antimony doped $SnO_2$ (ATO), FTO (F doped $SnO_2$), tin oxide ($SnO_2$), zinc oxide (ZnO), B doped ZnO, InSnZnO, NiO or ITiO (Ti doped $In_2O_3$). Among them, ITO or ITiO is desirably used.

In the light receiving elements according to first and second features of the present disclosure including the above-described various desirable embodiments and structures (hereinafter may be referred to as "the light receiving elements according to the present disclosure"), a variety of compound semiconductor layers can be formed by an organic metal chemical vapor deposition method (a MOCVD method, a MOVPE method), a molecular beam epitaxy method (a MBE method) or a hydride vapor deposition method where halogen contributes to transfer or reaction.

The transparent conductive material layer can be basically formed by the sputtering method. In order to include the additive in the transparent conductive material of the transparent conductive material layer, a target formed of the transparent conductive material (called as a "transparent conductive material target") and a target formed of the additive (called as an "additive target") are disposed within a sputtering apparatus, for example. Using the additive target, sputtering is performed. After the additive is adhered to the transparent conductive material target, without a so-called pre-sputtering, the transparent conductive material target to which the additive is adhered is used for sputtering to form the transparent conductive material including the additive. It is noted that the formation of the transparent conductive material layer is not limited to this method.

In the light receiving elements according to the present disclosure, a second electrode is disposed in addition to the transparent conductive material layer (hereinafter may be referred to as a "first electrode"). The second electrode is formed in contact with the chemical semiconductor layer formed of the third compound semiconductor. Examples of the second electrode include molybdenum (Mo), tungsten (W), tantalum (Ta), vanadium (V), palladium (Pd), Zinc (Zn), nickel (Ni), titanium (Ti), platinum (Pt), gold-zinc (Au—Zn), gold-germanium (AuGe), chromium (Cr), gold (Au) and aluminum (Al).

In image capturing apparatuses according to the first and second features of the present disclosure, the second electrode is disposed at each image capturing element. On the other hand, the transparent conductive material layer (the first electrode) can be common to a plurality of image capturing elements. In other words, the transparent conductive material layer (the first electrode) can be a so-called solid film.

The light receiving element, the image capturing element and the image capturing apparatus according to first and second features of the present disclosure can be produced by the method described below. In other words, a laminated structure of the surface recombination prevention layer, the photoelectric conversion layer and the compound semiconductor layer is formed on a film-forming substrate by a well-known method. The second electrode is formed on the compound semiconductor layer, the compound semiconductor layer between the light receiving elements is removed or the compound semiconductor layer between the light receiving elements is subjected to ion implantation or impurity diffusion treatment to isolate the light receiving elements in a certain kind of way. On the other hand, a variety of circuits for driving the light receiving elements are formed on the silicon semiconductor substrate, for example. On the silicon semiconductor substrate, a bump for connecting to the second electrode of the light receiving element is formed in advance. Then, the second electrode formed on the film-forming substrate is connected to the bump formed on the silicon semiconductor substrate. For the connection, a TCV (through contact via) can be used otherwise. Next, the film-forming substrate is removed by an etching method, a polishing method, a CMP method, a laser ablation method, a heating method or the like. In addition, the surface recombination prevention layer is thinned by an etching method as necessary. Thereafter, the transparent conductive material layer is formed on the surface of the surface recombination prevention layer and the antireflection film is formed as necessary. Next, a filter (a color filter, a visible light cut filter, an infrared cut filter, for example) and a light collecting lens (an on-chip lens) are formed on or above the surface recombination prevention layer as necessary.

As the film-forming substrate, a substrate formed of III-V group semiconductor can be used. Specifically, examples of the III-V group semiconductor substrate include GaAs, InP, GaN, AlN, GaP, GaSb, InAs, Si, sapphire and SiC.

As the case may be, the light receiving element may be fixed to the support substrate via the second electrode. Also in this case, after the light receiving element is formed on the film-forming substrate, the light receiving element is fixed or adhered to the support substrate, and the film-forming substrate may be removed from the light receiving element. The film-forming substrate is removed from the light receiving element using the above-described methods. The light receiving element is fixed or adhered to the support substrate by a metal joining method, a semiconductor joining method or a metal-semiconductor joining method as well as using an adhesive agent. Other than the substrates illustrated as the film-forming substrate, a transparent inorganic substrate such as a silicon semiconductor substrate, a glass substrate and a quartz substrate; and a transparent plastic substrate or film formed of polyester resin such as polyethylene terephthalate (PET) and polyethylene naphthalate (PEN), polycarbonate (PC) resin, polyether sulfone (PES) resin, polyolefin resin such as polystyrene, polyethylene and polypropylene, polyphenylene sulfide resin, polyvinylidene fluoride resin, tetra acetyl cellulose resin, brominated phenoxy resin, aramid resin, polyimide resin, polystyrene resin, polyarylate resin, polysulfone resin, acrylic resin, epoxy resin, fluororesin, silicone resin, diacetate resin, triacetate resin, polyvinyl chloride resin and cyclic polyolefin resin. Examples of the glass substrate include a soda glass substrate, a heat resistant glass substrate and a quartz glass substrate.

A CMOS image sensor or a CCD image sensor is composed of the light receiving elements or the image capturing elements.

The image capturing element unit in the image capturing apparatus may be composed of:

(A) one light receiving element or image capturing element according to the first and second features of the present disclosure (the light receiving element or the image capturing element receives light ranging from visible light to infrared light), (B) one first image capturing element equipped with the infrared cut filter according to the first and second features of the present disclosure (the image capturing element receives visible light) and one second image capturing element equipped with the infrared cut filter according to the first and second features of the present disclosure (the image capturing element receives visible light), and (C) one red color image capturing element equipped with a red color filter according to the first and second features of the present disclosure (the image capturing element receives red light), one green color image capturing element equipped with a green color filter according to the first and second features of the present disclosure (the image capturing element receives green light), one blue color image capturing element equipped with a blue color filter according to the first and second features of the present disclosure (the image capturing element receives blue light), and one infrared image capturing element equipped with a visible light cut filter according to the first and second features of the present disclosure (the image capturing element receives infrared light). The configuration and the structures of the image capturing apparatus excluding the image capturing element can be the same as the configuration and the structures of the well-known image capturing apparatus. A variety of treatments of the signals provided by the image capturing element can be performed based on the well-known circuits.

First Embodiment

Figure 1B:
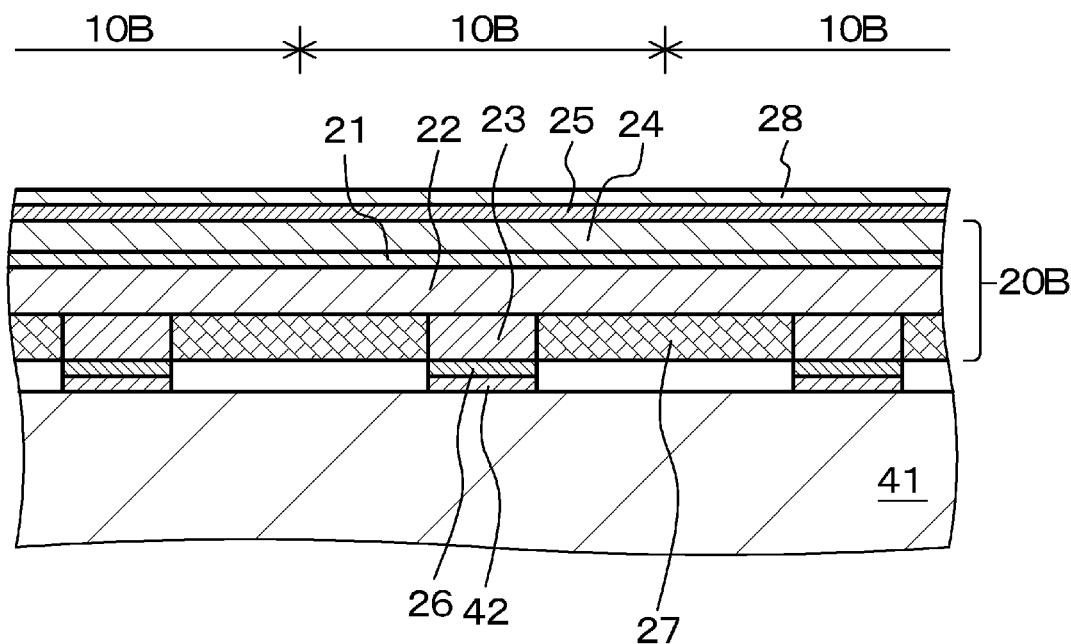

The first embodiment relates to the light receiving element according to the first feature of the present disclosure. As shown in FIG. 1A, a light receiving element 10A in the first embodiment includes a laminated structure (a laminated structure 20A) of:

a surface recombination prevention layer 21 composed of a first compound semiconductor on which light is incident, a photoelectric conversion layer 22 composed of a second compound semiconductor, and a compound semiconductor layer 23 composed of a third compound semiconductor, the surface recombination prevention layer 21 (which is also called as a window layer) having a thickness of 30 nm or less. In FIGS. 1A and 1B, three light receiving elements are shown.

Specifically, in the light receiving element 10A in the first embodiment, the surface recombination prevention layer 21 is composed of n type InP (i.e., the first compound semiconductor is an n type compound semiconductor), the photoelectric conversion layer 22 is composed of i type InGaAs (i.e., the second compound semiconductor is an i type compound semiconductor), and the compound semiconductor layer 23 is composed of p type InP (i.e., the third compound semiconductor is a p type compound semiconductor).

In the light receiving element in the first embodiment, when a band gap of the first compound semiconductor is represented by $BG_1$, a band gap of the second compound semiconductor is represented by $BG_2$, and a band gap of the third compound semiconductor is represented by $BG_3$, $BG_1$=1.35 eV
$BG_2$=0.74 eV
$BG_3$=1.35 eV, and the $BG_1$, $BG_2$ and $BG_3$ satisfy $BG_1 > BG_2$ and $BG_3 > BG_2$.

Furthermore, in the light receiving element in the first embodiment, a transparent conductive material layer (first electrode, transparent electrode layer) 25 is formed on a light incident surface of the surface recombination prevention layer 21. Here, the transparent conductive material layer 25 is composed of ITO, ITiO or NiO. A second electrode 26 is formed in contact with the compound semiconductor layer 23. The second electrode 26 is composed of Ti/W/Cu. Furthermore, an antireflection film 28 composed of $SiO_2$ is formed on a light incident surface of the transparent conductive material layer 25.

Figure 2:
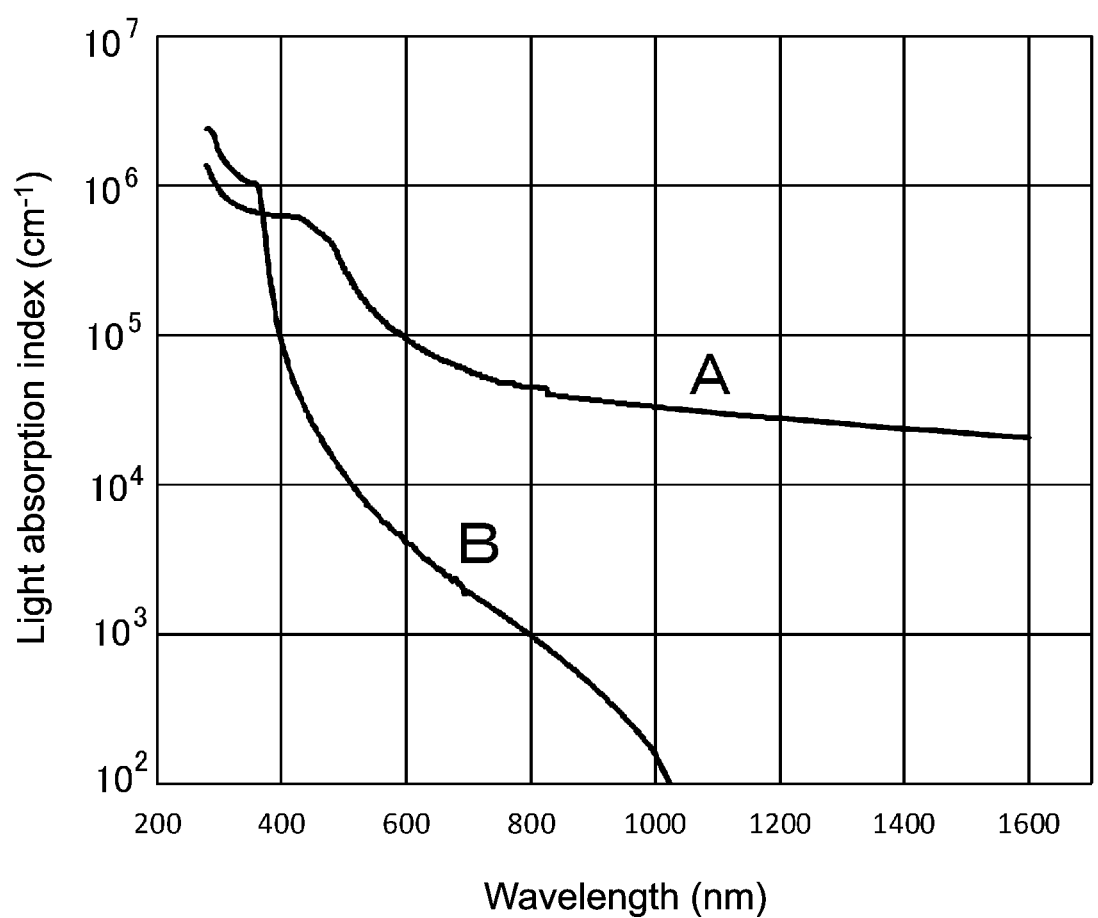
FIG. 2 is a graph of optical absorption coefficients of InGaAs and Si versus a wavelength.
Figure 3:
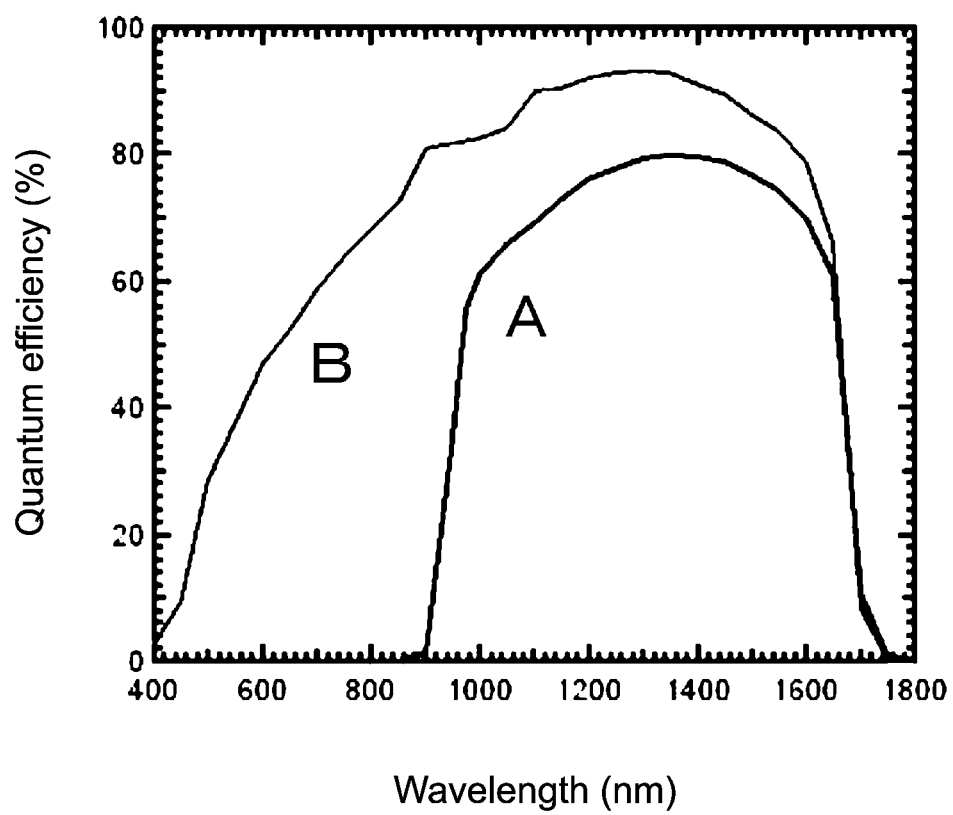
FIG. 3 is a graph of quantum efficiency of InGaAs having an InP substrate and no InP substrate versus a wavelength.
Figure 4:
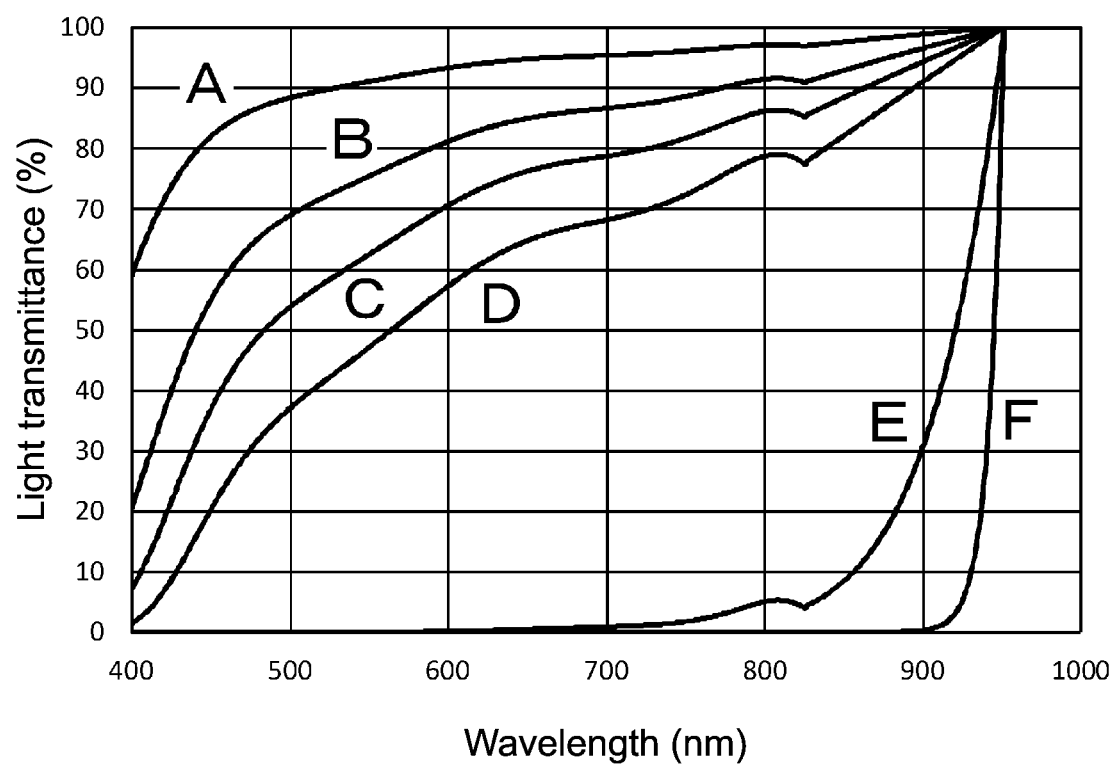
FIG. 4 is a graph showing calculation results of a thickness of an InP layer, a light wavelength incident on the InP layer and a light transmission of the InP layer.

FIG. 2 shows optical absorption coefficients of InGaAs ("A" in FIG. 2) and an optical absorption coefficient of Si ("B" in FIG. 2) versus a wavelength. For reference, FIG. 3 shows quantum efficiency of InGaAs having an InP substrate and no InP substrate versus a wavelength (specifically, "A" in FIG. 3 represents that the InP substrate is included and "B" in FIG. 3 represents that the InP substrate is etched as thinner as possible and removed). As described above, Si cannot absorb the light having a wavelength of 1.1 μm or more. InGaAs can absorb the light ranging from visible light to infrared light. FIG. 4 shows calculation results of a thickness of an InP layer, a light wavelength incident on the InP layer and a light transmission of the InP layer. In FIG. 4, "A" represents data when the InP layer has a thickness of 10 nm, "B" represents data when the InP layer has a thickness of 30 nm, "C" represents data when the InP layer has a thickness of 50 nm, "D" represents data when the InP layer has a thickness of 80 nm, "E" represents data when the InP layer has a thickness of 1 μm, and "F" represents data when the InP layer has a thickness of 5 μm. FIG. 4 reveals that the thin InP layer allows a passage of the visible light but the thick InP layer prevents a passage of the infrared light. If the thickness of the surface recombination prevention layer 21 composed of InP exceeds 30 nm, the visible light is undesirably much absorbed by the surface recombination prevention layer 21 composed of InP. Therefore, in the light receiving element according to the embodiment of the present disclosure, the thickness of the surface recombination prevention layer 21 is defined as 30 nm or less.

Figure 5A:
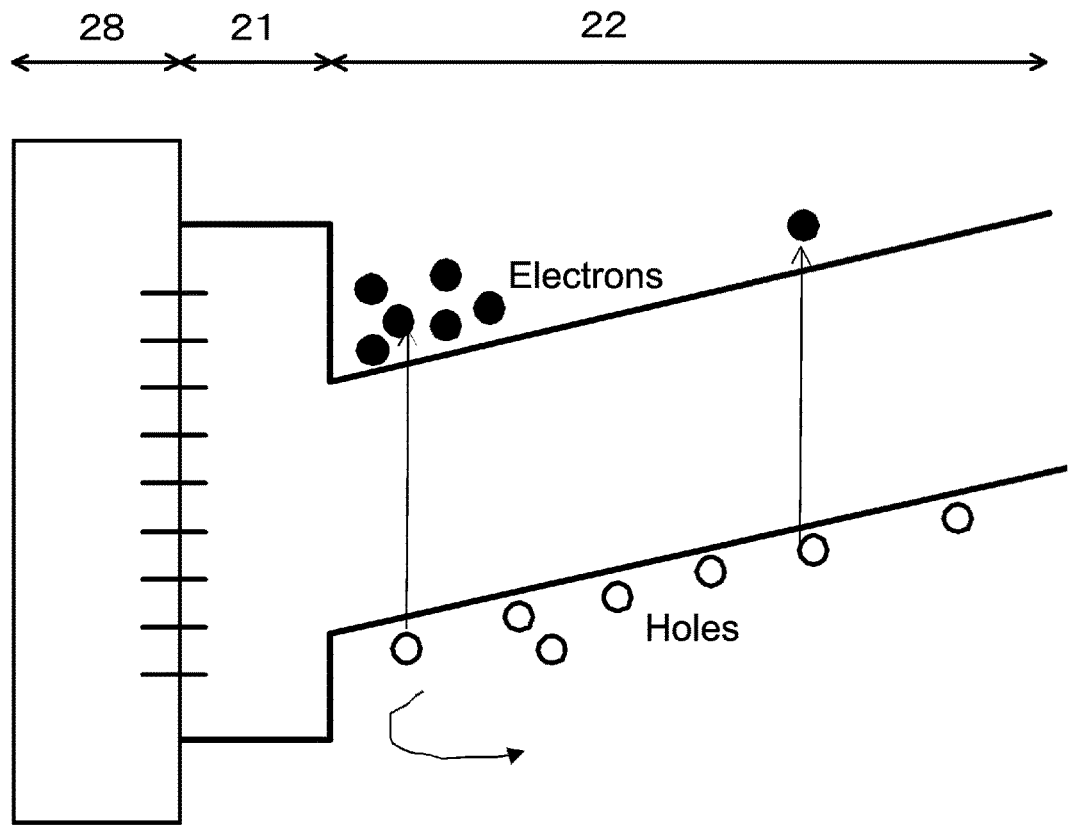
FIGS. 5A and 5B each is a conceptual diagram of a band structure in the light receiving element in the first embodiment.
Figure 5B:
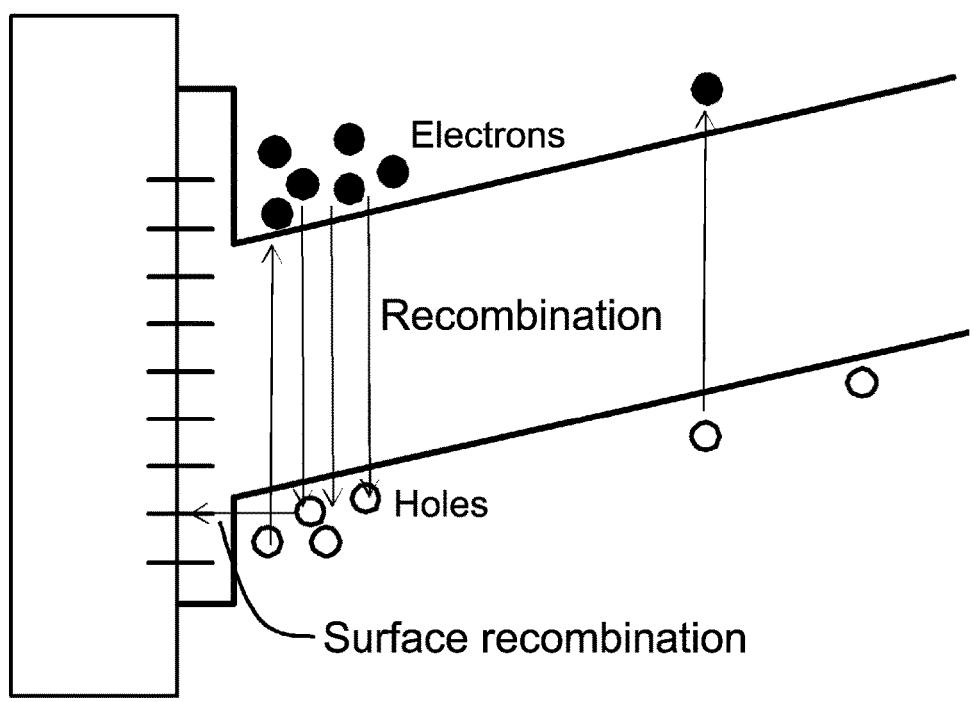
Figure 6:
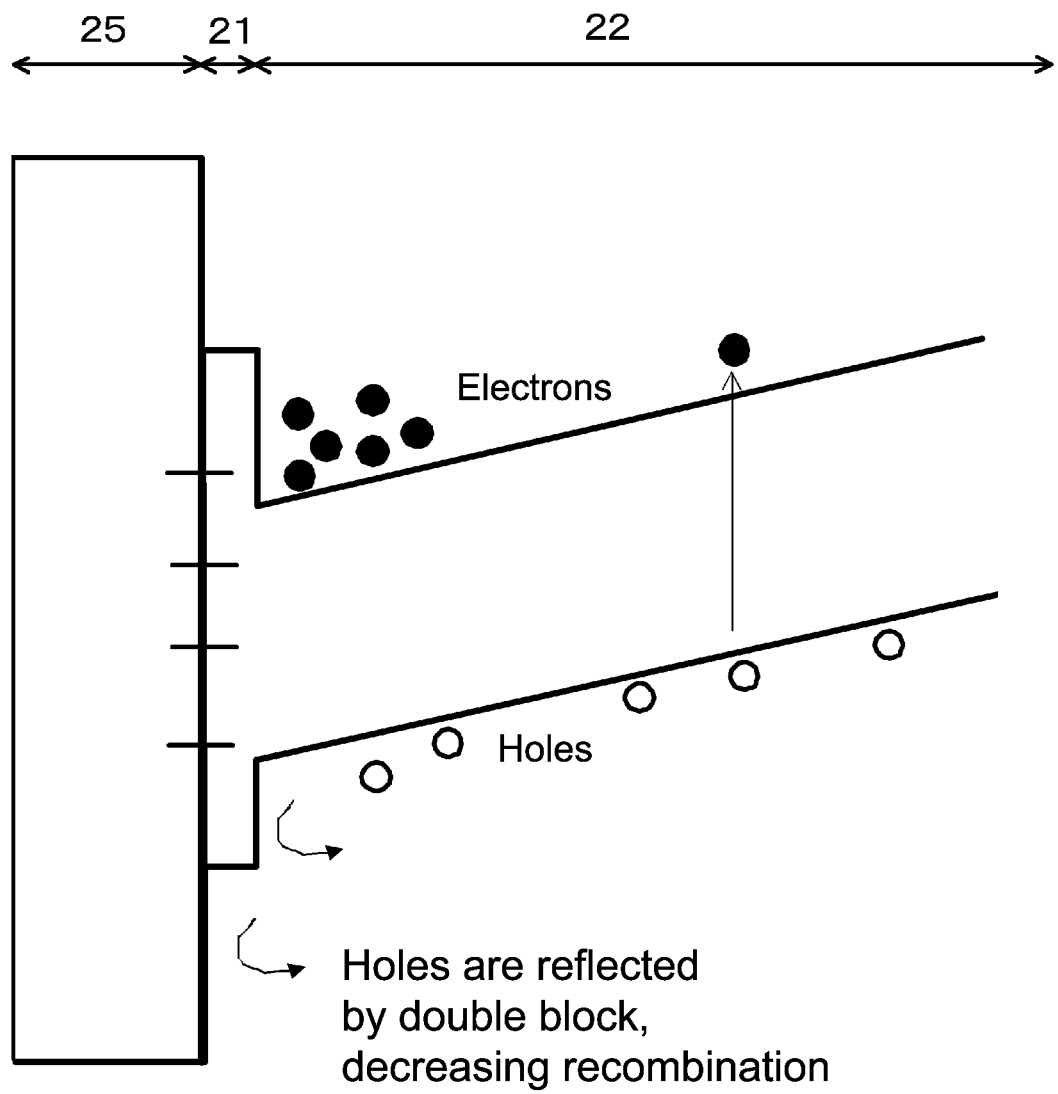
FIG. 6 is a conceptual diagram of a band structure in the light receiving element in the first embodiment.

FIGS. 5A and 5B each is a conceptual diagram of a band structure in the light receiving element in the first embodiment (note that the transparent conductive material layer 25 is not yet formed). In FIGS. 5A and 5B, FIG. 6 and FIG. 7 as described later, white circles schematically show holes and black circles schematically show electrons. Here, FIG. 5A shows that the surface recombination prevention layer 21 has the suitable thickness of 30 nm or less and FIG. 5B shows that the surface recombination prevention layer 21 has too thin thickness. When the surface recombination prevention layer 21 has too thin thickness, the holes existed at an interface between the surface recombination prevention layer 21 and the photoelectric conversion layer 22 are recombined on the surface. As a result, hole-electron pairs are lost. A lower limit value of the thickness of the surface recombination prevention layer 21 can be 10 nm, for example. FIG. 6 is a conceptual diagram of a band structure after the transparent conductive material layer 25 is formed. As the transparent conductive material layer 25 composed of ITO or ITiO, NiO showing a behavior as the n type semiconductor, the holes are reflected by a double block. As a result, the surface recombination is further decreased. Then, by applying a reverse bias to the transparent conductive material layer (first electrode 25) and the second electrode (such that the transparent conductive material layer 25 has a positive potential and the second electrode has a negative potential), the light receiving element 10A is operated.

In the first embodiment, the surface recombination prevention layer 21 has the thickness of 30 nm or less, specifically 10 nm. Accordingly, the surface recombination prevention layer 21 composed of InP allows the passage of the light ranging from visible light to infrared light. The photoelectric conversion layer 22 composed of InGaAs can absorb the light ranging from visible light to infrared light, and can also prevent the surface recombination. Therefore, there can be provided the light receiving element having a high sensitivity from a visible region to an infrared region.

The light receiving element in the first embodiment, a light receiving element in a second embodiment, an image capturing element and an image capturing apparatus in a third embodiment as described later can be produced by the following method.

[Step-100]

Figure 12A:
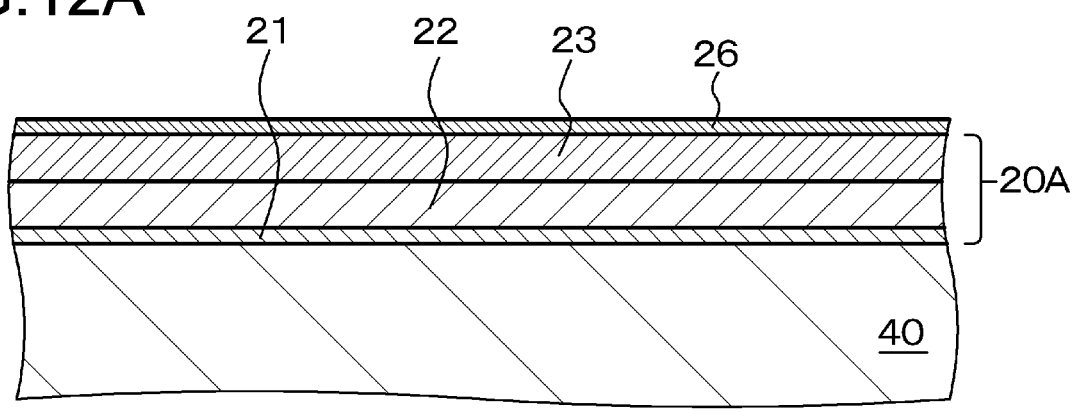
FIGS. 12A and 12B each is a schematically partial end elevation of a laminated structure for illustrating a method of producing the light receiving element in the first embodiment after FIG. 12B.

First, based on the well-known method, the laminated structure 20A of the surface recombination prevention layer 21, the photoelectric conversion layer 22 and the compound semiconductor layer 23 (a laminated structure 20B of a contact layer 24, the surface recombination prevention layer 21, the photoelectric conversion layer 22 and the compound semiconductor layer 23 in the second embodiment) is formed on a film-forming substrate 40 composed of InP. Although not shown, a buffer layer, an etching stop layer, a polishing etching stop layer and the like may be formed between the film-forming substrate 40 and the surface recombination prevention layer 21 (or the contact layer 24). In this manner, the structure shown in FIG. 12A is provided. Next, based on a lift off method, for example, the second electrode is formed on a desirable area of the compound semiconductor layer 23.

[Step-110]

Figure 12B:
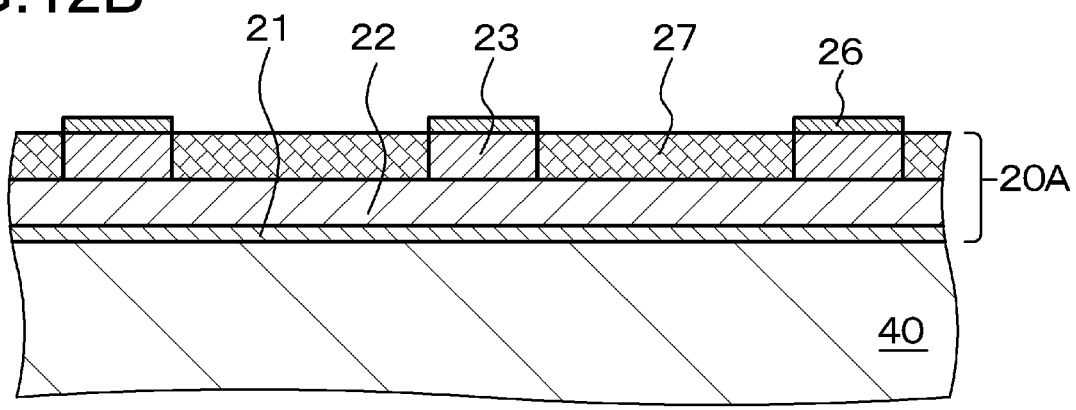

Next, the compound semiconductor layer 23 between the light receiving elements is removed to form an insulation layer 27 composed of $SiO_2$. The insulation layer 27 isolates the receiving elements. In this manner, the structure shown in FIG. 12B is provided. The insulation layer 27 may extend to the photoelectric conversion layer 22, for example. Alternatively, the compound semiconductor layer 23 between the light receiving elements may be ion-implanted (as the case may be, the photoelectric conversion layer 22 may be partly or fully ion-implanted in a thickness direction) to isolate the light receiving elements.

[Step-120]

Figure 13A:
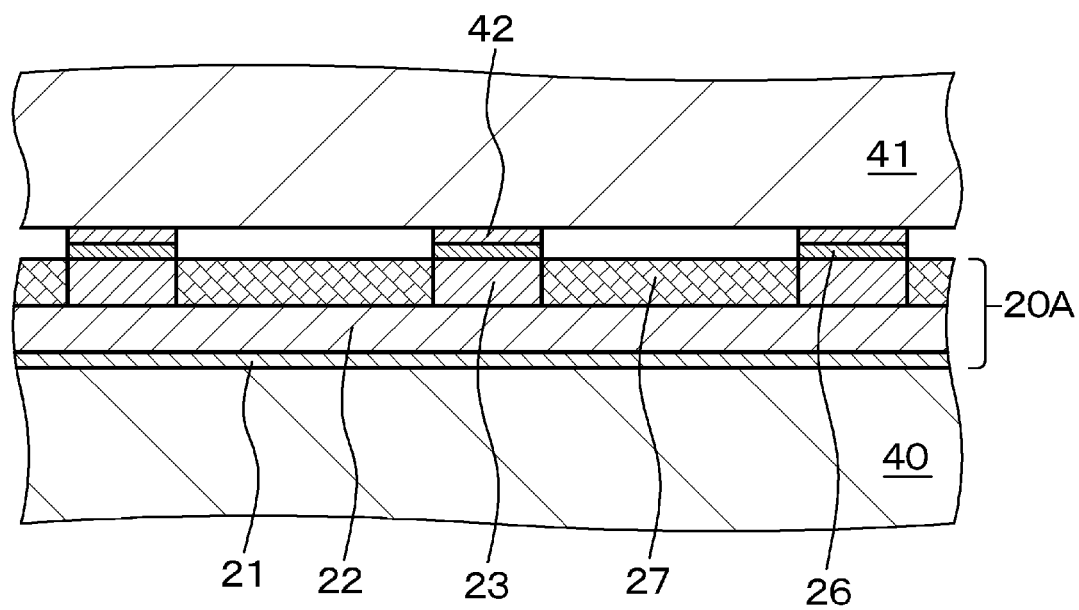
FIGS. 13A and 13B each is a schematically partial end elevation of a laminated structure for illustrating a method of producing the light receiving element in the first embodiment after FIG. 12B.

In the meantime, a variety of circuits (not shown) for driving the light receiving elements are formed on the silicon semiconductor substrate 41. A bump 42 composed of an In alloy or an Sn alloy is formed for connection to the second electrode 26 of the light receiving element. Then, the second electrode 26 formed on the film-forming substrate 40 and the bump 42 disposed on the silicon semiconductor substrate 41 are connected. In this manner, the structure shown in FIG. 13A is provided. Although FIG. 13A shows as if the bump 42 is formed on the surface of the silicon semiconductor substrate 41, the surface of the silicon semiconductor substrate 41 on which a variety of circuits are formed is coated with an insulation layer (not shown) and the bump 42 connected to a variety of the circuits is formed on the surface of the insulation layer.

[Step-130]

Figure 13B:
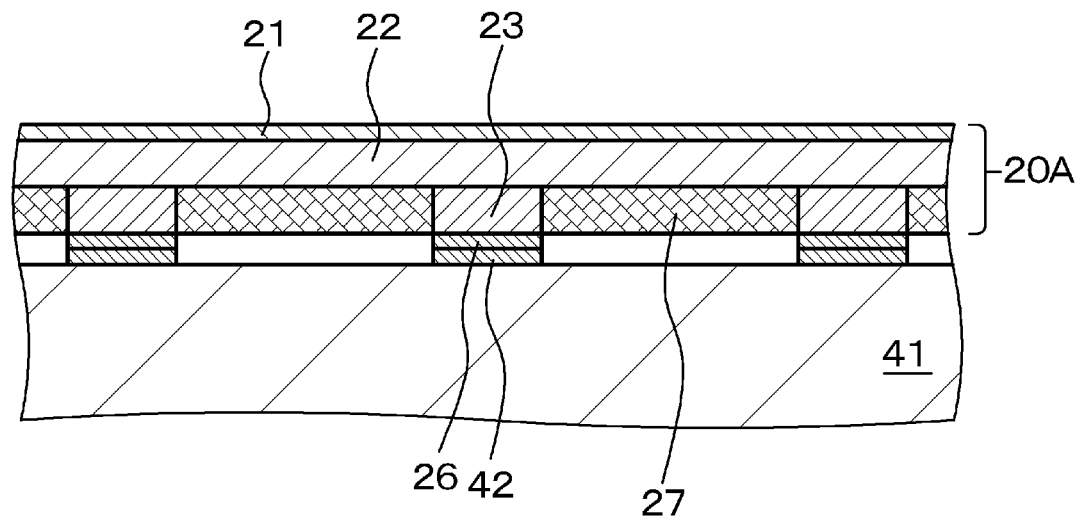

Next, the film-forming substrate 40 is removed by an etching method, a polishing method, a CMP method, a laser ablation method, a heating method or the like. In addition, the surface recombination prevention layer 21 is thinned by an etching method or the like as necessary. In this manner, the structure shown in FIG. 13B is provided.

[Step-140]

Thereafter, the transparent conductive material layer 25 and the antireflection film 28 are formed sequentially on the surface of the surface recombination prevention layer 21. In this manner, the structure shown in FIG. 1A is provided.

[Step-150]

Upon the production of the image capturing element, a planarization film 29 is formed on the antireflection film 28, and a filter 30 and a light collecting lens (an on-chip lens) 31 are formed on the planarization film 29.

In the light receiving element in the first embodiment or the image capturing element in the third embodiment, the transparent conductive material layer (first electrode) 25 that is a solid electrode is formed above of the laminated structure 20A and the second electrode 26 is formed below of the laminated structure 20B, thereby simplifying the configuration and the structure. As the transparent conductive material layer 25 is the solid electrode, a travel distance of electrons taken out from the transparent conductive material layer 25 to the circuits for driving the light receiving element is not changed depending on the position of each light receiving element as compared to the structure where wiring is formed individually to the first electrode of each light receiving element. In addition, a signal is taken out in a thickness direction of the laminated structure constituting the light receiving element (a signal is taken out from a PN structure in a longitudinal direction), thereby generating less variation in a signal accuracy.

Second Embodiment

The second embodiment relates to the light receiving element according to the second feature of the present disclosure. As shown in FIG. 1B, a light receiving element 10B in the second embodiment includes a laminated structure (a laminated structure 20B) of:

a transparent conductive material layer (first electrode) 25 on which light is incident, a surface recombination prevention layer 21 composed of a first compound semiconductor, a photoelectric conversion layer 22 composed of a second compound semiconductor, and a compound semiconductor layer 23 composed of a third compound semiconductor, further including:

a contact layer 24 composed of a fourth compound semiconductor formed between the transparent conductive material layer 25 and the surface recombination prevention layer 21, the surface recombination prevention layer 21 having a thickness of 30 nm or less, and the contact layer 24 having a thickness of 20 nm or less.

Specifically, in the light receiving element 10B in the second embodiment, the contact layer 24 is composed of n type InGaAs (i.e., the fourth compound semiconductor is an $n^+$ type compound semiconductor), the surface recombination prevention layer 21 is composed of n type InP (i.e., the first compound semiconductor is an n type compound semiconductor), the photoelectric conversion layer 22 is composed of i type InGaAs (i.e., the second compound semiconductor is an i type compound semiconductor), and the compound semiconductor layer 23 is composed of p type InP (i.e., the third compound semiconductor is a p type compound semiconductor).

In the light receiving element in the second embodiment, when a band gap of the first compound semiconductor is represented by $BG_1$, a band gap of the second compound semiconductor is represented by $BG_2$, a band gap of the third compound semiconductor is represented by $BG_3$ and a band gap of the third compound semiconductor is represented by $BG_4$, $BG_1$=1.35 eV
$BG_2$=0.74 eV
$BG_3$=1.35 eV,
$BG_4$=0.74 eV, and the $BG_1$, $BG_2$, $BG_3$ and $BG_4$ satisfy $BG_1 > BG_2$ and $BG_3 > BG_2$ and $BG_1 > BG_4$.

Furthermore, also in the light receiving element in the second embodiment, the transparent conductive material layer 25 is composed of ITO, ITiO or NiO. Similar to the first embodiment, the second electrode 26 is formed in contact with the compound semiconductor layer 23. The antireflection film 28 is formed on a light incident surface of the transparent conductive material layer 25.

Figure 7:
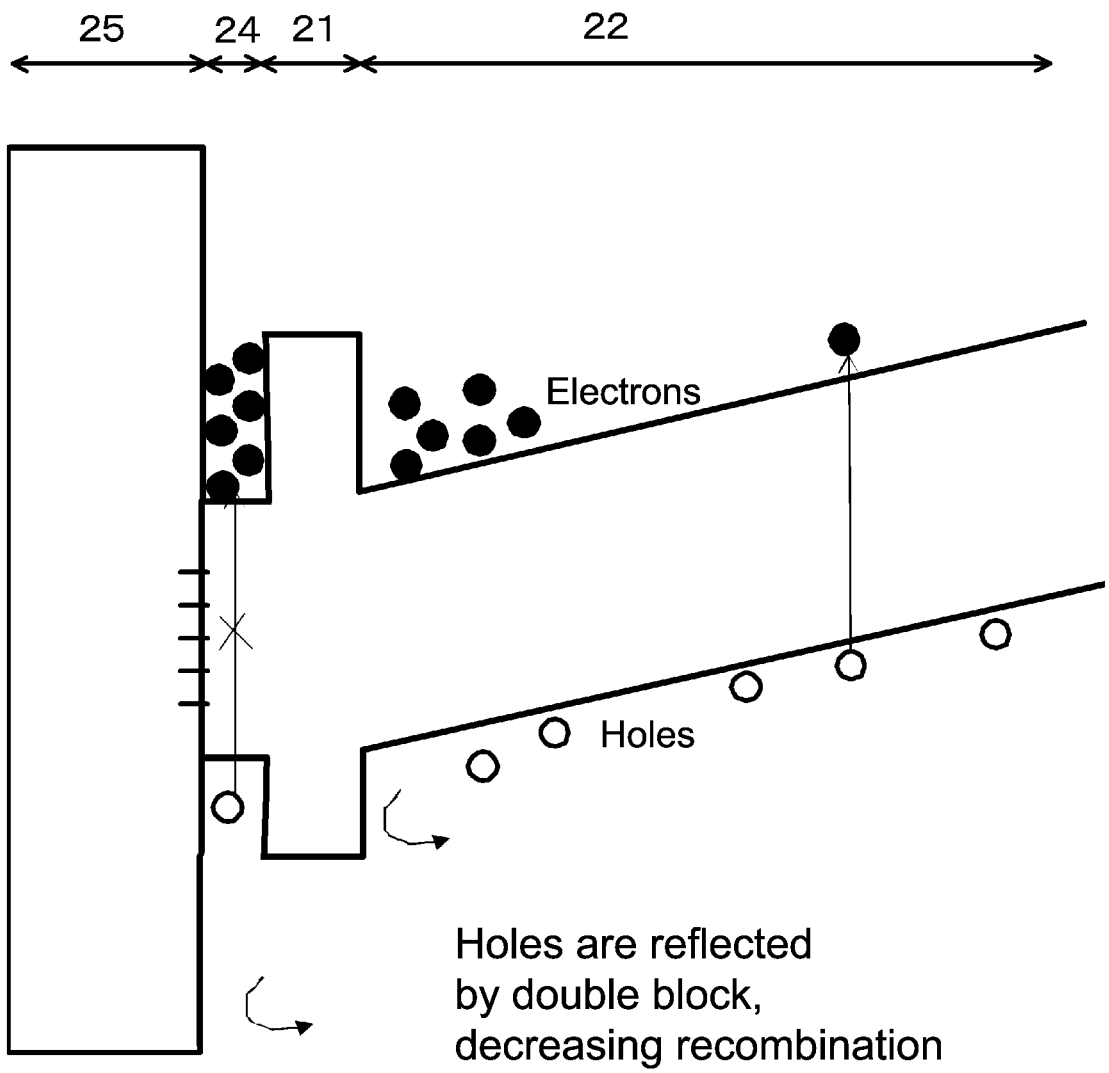
FIG. 7 is a conceptual diagram of a band structure in the light receiving element in the second embodiment.

FIG. 7 shows a conceptual diagram of a band structure in the light receiving element in the second embodiment. In the second embodiment, the contact layer 24 having a thickness of 10 nm is formed. In the contact layer 24, electrons are saturated. Accordingly, the contact layer 24 does not absorb light and is transparent. In addition, the contact layer 24 is composed of n type InGaAs, which can decrease a contact resistance. N type impurity concentrations of the contact layer 24 and the surface recombination prevention layer 21 are as described below. Similar to the first embodiment, as the transparent conductive material layer 25 composed of ITO or ITiO, NiO showing a behavior as the n type semiconductor, the holes are reflected by a double block. As a result, the surface recombination is further decreased. If the thickness of the contact layer 24 composed of InGaAs exceeds 20 nm, the contact layer 24 undesirably begins to absorb light. Therefore, in the light receiving element according to the embodiment of the present disclosure, the thickness of the contact layer 24 is defined as 20 nm or less. If the contact layer 24 has a thickness of less than 10, it is difficult to decrease the contact resistance. An impurity concentration range of the contact layer 24 can be $1 \times 10^{18}$ cm$^{-3}$ to $5 \times 10^{20}$ cm$^{-3}$. An impurity concentration range of the surface recombination prevention layer 21 can be $1 \times 10^{17}$ cm$^{-3}$ to $5 \times 10^{19}$ cm$^{-3}$.

Contact layer 24: $1 \times 10^{19}$ cm$^{-3}$

Surface recombination prevention layer 21: $1 \times 10^{18}$ cm$^{-3}$

Also, in the second embodiment, the surface recombination prevention layer 21 has the thickness of 30 nm or less. Accordingly, the surface recombination prevention layer 21 composed of InP allows the passage of the light ranging from visible light to infrared light. The photoelectric conversion layer 22 composed of InGaAs can absorb the light ranging from visible light to infrared light, and can also prevent the surface recombination. Therefore, there can be provided the light receiving element having a high sensitivity from a visible region to an infrared region. In addition, as the contact layer 24 absorbing no light is disposed, the contact resistance can be decreased.

Third Embodiment

Figure 8A:
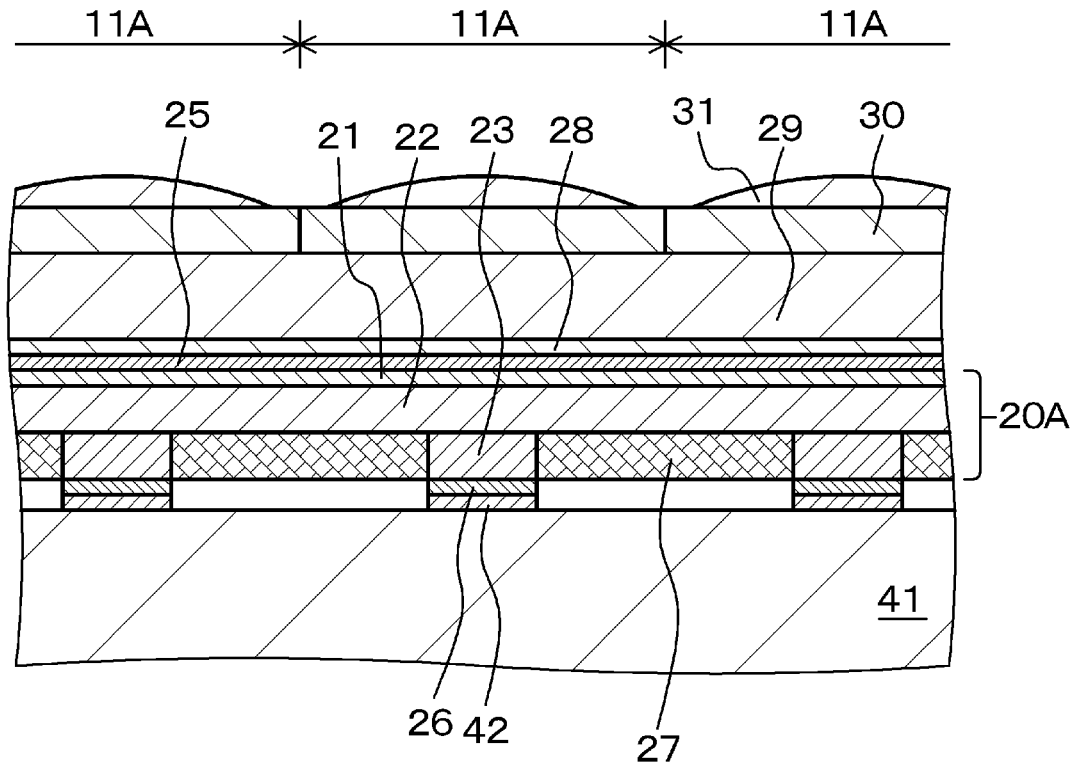
FIGS. 8A and 8B are schematic partial sectional diagrams of light receiving elements in a third embodiment.
Figure 8B:
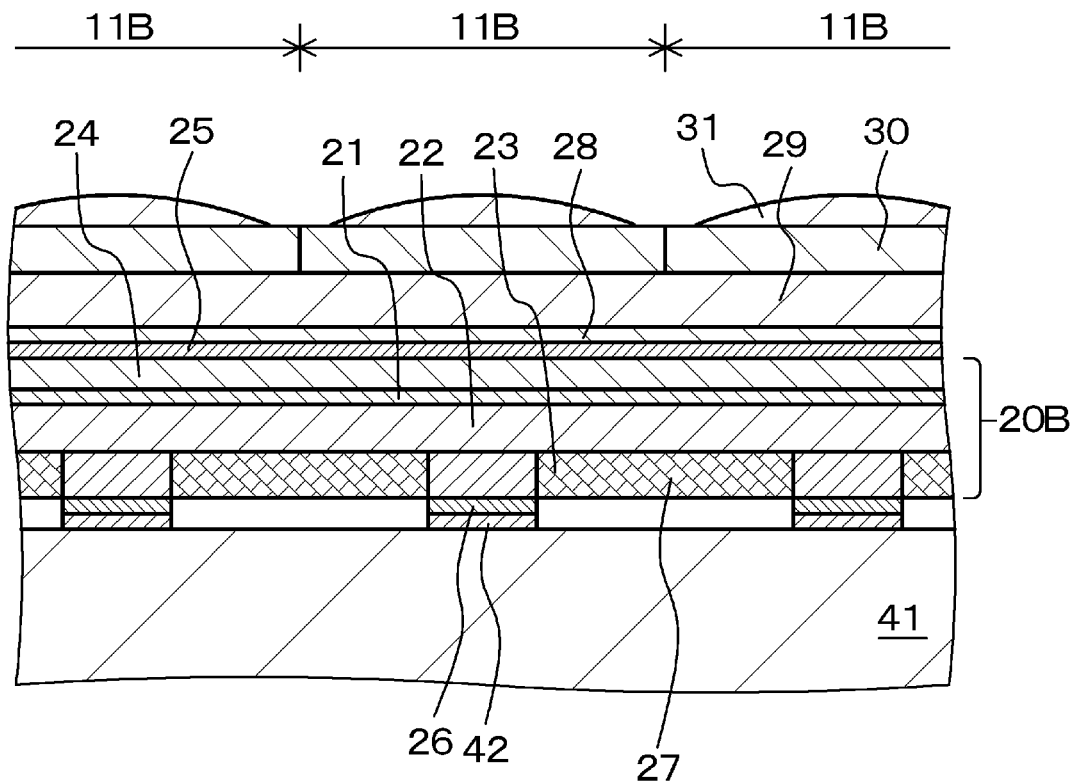

The third embodiment relates to an image capturing element and an image capturing apparatus according to the first or second feature of the present disclosure. FIG. 8A shows a schematic partial sectional diagram of an image capturing element 11A in the third embodiment to which the light receiving element in the first embodiment is applied. FIG. 8B shows a schematic partial sectional diagram of an image capturing element 11B in the third embodiment to which the light receiving element in the second embodiment is applied. In FIGS. 8A and 8B, three light receiving elements are shown.

The image capturing elements 11A and 11B in the third embodiment include the light receiving elements 10A and 10B and filters 30 for passing light having a desirable wavelength disposed at the light incident side of the light receiving elements 10A and 10B as described in the first and second embodiments. The image capturing apparatus in the third embodiment includes a plurality of the image capturing elements including the light receiving elements 10A and 10B and filters 30 for passing light having a desirable wavelength disposed at the light incident side of the light receiving elements 10A and 10B as described in the first or second embodiment. The image capturing elements are arranged in a two-dimensional matrix.

Specifically, in the image capturing element in the third embodiment, the planarization film 29 is formed on the antireflection film 28, and a filter 30 and a light collecting lens (an on-chip lens) 31 are formed on the planarization film 29. By the image receiving elements 10A and 10B or the image capturing elements 11A and 11B, a CMOS image sensor or a CCD image sensor is configured.

FIGS. 9A and 9B and FIG. 10 each is a diagram schematically showing the image capturing element unit in the image capturing apparatus in the third embodiment. In FIGS. 9A, 9B and 10, the image capturing element units are shown in a solid rectangle. In FIG. 9B and FIG. 10, the image capturing elements are shown in dotted lines.

In other words, in FIG. 9A showing 4×4 image capturing elements, the image capturing element unit in the image capturing apparatus in the third embodiment is composed of one of the light receiving elements in the first or second embodiment, or an image capturing element 101 composed of the light receiving element. The light receiving element 101 receives the light ranging from visible light to infrared light, thereby providing an image where white/black (monochrome) image and an infrared image are shown.

In FIG. 9B showing 4×4 image capturing elements and 2×4 image capturing element units, the image capturing element unit in the image capturing apparatus in the third embodiment is composed of a first image capturing element 101W having one of the light receiving elements in the first or second embodiment including the infrared cut filter, and a second image capturing element 102 composed of the light receiving element having one of the light receiving elements in the first or second embodiment including the infrared cut filter. Here, the light receiving element 101W receives the visible light and the second image capturing element 102 receives the infrared light, thereby providing an image where white/black (monochrome) image and an infrared image are shown.

In FIG. 10 showing 4×4 image capturing elements and 2×4 image capturing element units, the image capturing element unit in the image capturing apparatus in the third embodiment is composed of a red color image capturing element 101R composed of one light receiving element in the first or second embodiment equipped with a red color filter transmitting a red color, a green color image capturing element 101G composed of one light receiving element in the first or second embodiment equipped with a green color filter transmitting a greed color, a blue color image capturing element 101B composed of one light receiving element in the first or second embodiment equipped with a blue color filter transmitting a blue color, and an infrared image capturing element 102 composed of one light receiving element in the first or second embodiment equipped with the visible light cut filter. Here, the red color image capturing element 101R receives red color light, the green color image capturing element 101G receives green color light, the blue color image capturing element 101B receives blue color light, and the infrared image capturing element 102 receives infrared light. In this manner, a color image and an infrared image can be captured independently.

Fourth Embodiment

The fourth embodiment is an alternative of the first to third embodiments. Specifically, it relates to an alternative of the transparent conductive material layer 25, more specifically, to a transparent conductive material layer having a first configuration.

Figure 11:
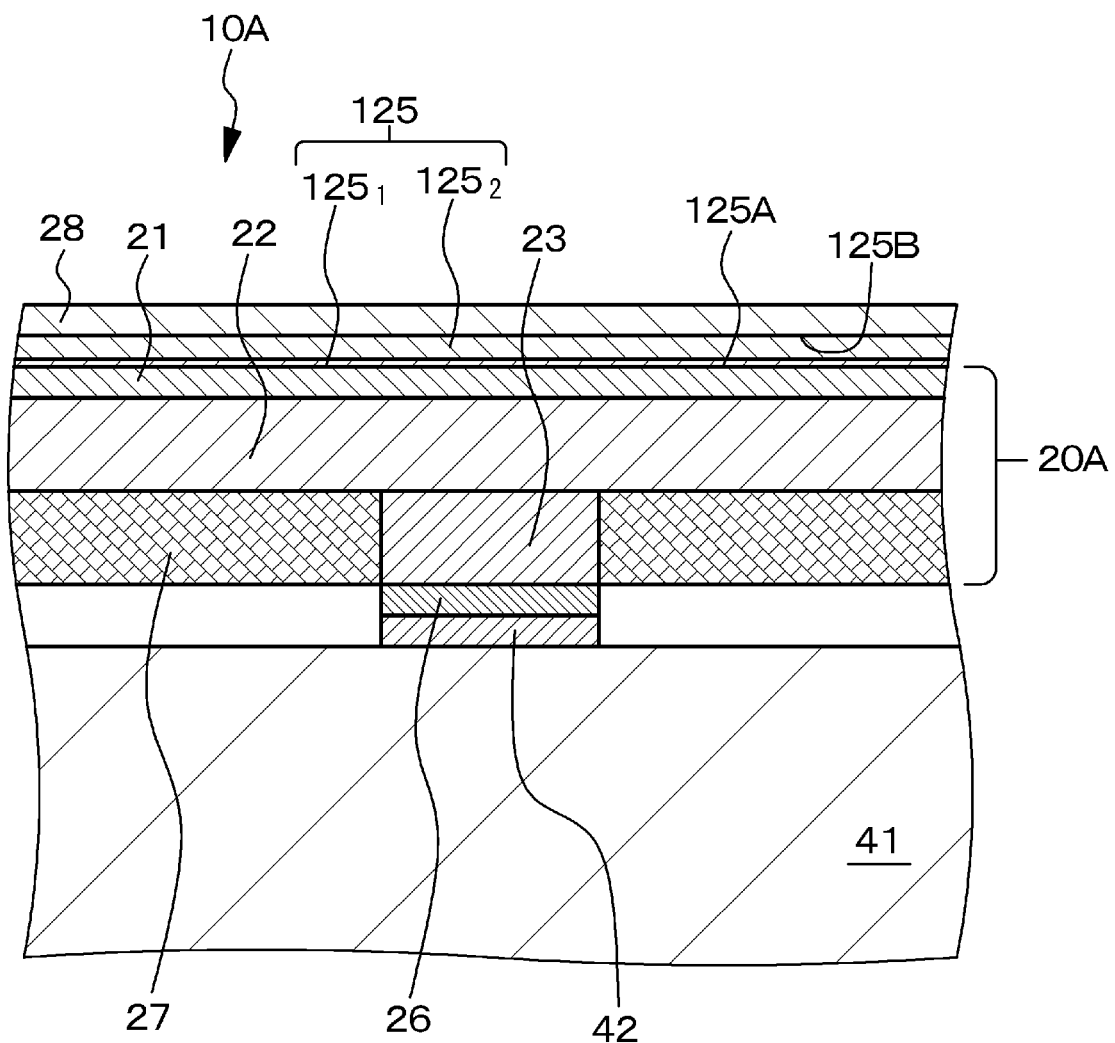
FIG. 11 is a schematically partial sectional diagram of a light receiving element in a fourth embodiment.

As shown in a schematically partial sectional diagram in FIG. 11, in the fourth embodiment, a transparent conductive material layer (first electrode, transparent electrode layer) 125 includes a first surface 125A in contact with the surface recombination prevention layer 21 or the contact layer and a second surface 125B facing to the first surface 125A, and is composed of the transparent conductive material. The transparent conductive material constituting the transparent conductive material layer 125 includes an additive composed of at least one metal selected from the group consisting of a group 6 transition metal such as molybdenum, tungsten and chromium; ruthenium; titanium; nickel; zinc; iron and copper, and a compound thereof (in the fourth embodiment, specifically, molybdenum, Mo). A concentration of the additive contained in the transparent conductive material near an interface of the first surface 125A of the transparent conductive material layer 125 (hereinafter referred to as a "first electrode 125") is higher than a concentration of the additive contained in the transparent conductive material near at the second surface 125B of the transparent conductive material layer (first electrode 125). Here, in the fourth embodiment, the transparent conductive material is ITiO.

In addition, in the fourth embodiment, the first electrode 125 includes a laminated structure of a first layer 1251 and a second layer 1252 from a side of the surface recombination prevention layer 21 or the contact layer. The transparent conductive material of the first layer 1251 includes the additive. The transparent conductive material of the first layer 1252 includes no additive. Specifically, an average concentration $Ic_1$ of the additive contained in the transparent conductive material of the first layer 1251 and an average concentration $Ic_2$ of the additive contained in the transparent conductive material of the second layer 1252 are shown in Table 1 below. When electric resistivity of the first layer is represented by $R_1$, electric resistivity of the second layer is represented by $R_2$, light transmittance of the first layer within a wavelength of 400 nm to 900 nm is represented by $TP_1$, light transmittance of the second layer within a wavelength of 400 nm to 900 nm is represented by $TP_2$, a thickness of the first layer is represented by $T_1$, and a thickness of the second layer is represented by $T_2$, these values are shown in Table 1. In addition, average transmittance of the first electrode 125, average electric resistivity of the first electrode 125, and a contact resistance value between the first electrode 125 and the surface recombination prevention layer 21 or the contact layer are shown in Table 1. An average light absorption index value of the first electrode is averaged at a measurement wavelength of 400 nm to 900 nm, measured by forming the first electrode (having a first layer thickness of 5 nm and a second layer thickness of 25 nm) on a glass substrate and excludes the light absorption index of the glass substrate.

TABLE 1

$Ic_1 = 1.1 \times 10^{17}$ cm$^{-3}$
$Ic_2 = 1.8 \times 10^{16}$ cm$^{-3}$
$R_1 = 2.5 \times 10^{-4}$ Ω · cm
$R_2 = 1.5 \times 10^{-4}$ Ω · cm
$TP_1 = 97\%$
$TP_2 = 99\%$
$T_1 = 5$ nm
$T_2 = 25$ nm
$Ic_1/Ic_2 = 6.1$
$R_2/R_1 = 0.6$
$TP_2 \times TP_1 = 0.96$
$T_2/T_1 = 5.0$
Average light transmittance of first electrode = 0.98%
Average electric resistivity of first electrode = $2 \times 10^{-4}$ Ω · cm or less
Contact resistance value between first electrode and surface recombination prevention layer or contact layer = $2.7 \times 10^{-5}$ Ω · cm$^2$ Specifically, the first electrode 125 is formed based on the following method. In other words, upon the formation of the first layer 1251 of the first electrode 125, there is prepared a sputtering apparatus on which a transparent conductive material target composed of a transparent conductive material (ITiO) and an additive target composed of an additive (Mo) are disposed. First, the additive target is used to sputter to attach the additive to the transparent conductive material target. Then, the film-forming substrate 40 on which laminated structures 20A and 20B having a plurality of compound semiconductor layers laminated are formed is brought into the sputtering apparatus. Without so-called pre-sputtering, the transparent conductive material target to which the additive is attached is used to perform the sputtering for the formation of the first layer the first layer 1251 of the first electrode 125. Thereafter, a clean transparent conductive material target is used to perform the sputtering for the formation of the second layer 1252 of the first electrode 125.

Except the above described points, the configuration and structure of the light receiving element in the fourth embodiment can be made the same as the configurations and structures of the light receiving elements in the first and second examples, the configuration and structure of the image capturing element and the image capturing apparatus in the fourth embodiment can be made the same as the configurations and structures of the image capturing element and the image capturing apparatus in the third example, and the detailed explanation will be omitted.

In the light receiving element in the fourth embodiment, the transparent conductive material of the first electrode 125 contains molybdenum (Mo), the concentration of the additive contained in the transparent conductive material near the interface of the first surface 125A of the first electrode 125 is higher than the concentration of the additive contained in the transparent conductive material near the interface of the first surface 125B of the first electrode 125, thereby providing the transparent conductive material layer (first electrode) 125 satisfying both a low contact resistance value and a high light transmittance.

Fifth Embodiment

The fifth embodiment is an alternative of the fourth embodiment. Specifically, it relates to a transparent conductive material layer having a second configuration.

In the fifth embodiment, the concentration of the additive contained in the transparent conductive material of the transparent conductive material layer is gradually decreased from the first surface to the second surface of the transparent conductive material layer. Specifically, the first electrode is prepared as follows: Similar to the fourth embodiment, there is prepared a sputtering apparatus on which a transparent conductive material target composed of a transparent conductive material (ITiO) and an additive target composed of an additive (Mo) are disposed. First, the additive target is used to sputter to attach the additive to the transparent conductive material target. Then, the film-forming substrate on which laminated structures where a plurality of compound semiconductor layers are laminated are formed is brought into the sputtering apparatus. Without so-called pre-sputtering, the transparent conductive material target to which the additive is attached is used to perform the sputtering for the formation of the first electrode 125. Thereafter, a heat treatment is performed, thereby generating a concentration gradient of Mo that is the impurity of the first electrode in the thickness direction. As a result, the concentration of the additive contained in the transparent conductive material of the first electrode can be gradually decreased from the first surface to the second surface of the first electrode.

Except the above described points, the configuration and structure of the light receiving element in the fifth embodiment can be made the same as the configurations and structures of the light receiving elements in the first and second examples, the configuration and structure of the image capturing element and the image capturing apparatus in the fifth embodiment can be made the same as the configurations and structures of the image capturing element and the image capturing apparatus in the third example, and the detailed explanation will be omitted.

While the present disclosure is described herein with reference to illustrative embodiments for particular applications, it should be understood that the present disclosure is not limited thereto. The configurations and structures of the light receiving elements, the image capturing elements and the image capturing apparatuses in the embodiments are only illustrative and can be changed as appropriate.

The present disclosure may have the following configurations.

[A01]<<Light Receiving Element, First Feature>>

A light receiving element, including:

a surface recombination prevention layer composed of a first compound semiconductor on which light is incident;

a photoelectric conversion layer composed of a second compound semiconductor; and a compound semiconductor layer composed of a third compound semiconductor, the surface recombination prevention layer having a thickness of 30 nm or less.

[A02] The light receiving element according to [A01] above, in which the surface recombination prevention layer comprises InP, InGaAsP or AlInAs, the photoelectric conversion layer comprises InGaAs, and the compound semiconductor layer comprises InP, InGaAsP or AlInAs.

[A03] The light receiving element according to [A01] or [A02] above, in which the first compound semiconductor is an n type compound semiconductor, the second compound semiconductor is an i type compound semiconductor, and the third compound semiconductor is a p type compound semiconductor.

[A04] The light receiving element according to [A01] above, in which when a band gap of the first compound semiconductor is represented by $BG_1$, a band gap of the second compound semiconductor is represented by $BG_2$, and a band gap of the third compound semiconductor is represented by $BG_3$, the $BG_1$, $BG_2$ and $BG_3$ satisfy $BG_1 > BG_2$ and $BG_3 > BG_2$.

[A05] The light receiving element according to any one of [A01] to [A04] above, in which a transparent conductive material layer is formed on a light incident surface of the surface recombination prevention layer.

[A06] The light receiving element according to [A05] above, in which the transparent conductive material layer comprises ITO, ITiO or NiO.

[B01] The light receiving element according to [A05] above, in which the transparent conductive material contains an additive composed of at least one metal selected from the group consisting of molybdenum, tungsten, chromium, ruthenium, titanium, nickel, zinc, iron and copper or a compound thereof, and a concentration of the additive contained in the transparent conductive material near an interface of the first surface of the transparent conductive material layer is higher than a concentration of the additive contained in the transparent conductive material near an interface of the second surface of the transparent conductive material layer.

[B02] The light receiving element according to [B01] above, in which the transparent conductive material include ITO, IZO, AZO, GZO, AlMgZnO, IGO, IGZO, IFO, ATO, FTO, $SnO_2$, ZnO, B doped ZnO, InSnZnO, NiO or ITiO.

[B03] The light receiving element according to [B01] or [B02] above, in which a supplemental electrode is formed on a second surface of the transparent conductive material layer.

[B04] The light receiving element according to any one of [B01] to [B03] above, in which the transparent conductive material layer has a laminated structure of a first layer and a second layer from a surface recombination prevention layer side, the transparent conductive material of the first layer contains an additive, and the transparent conductive material of the second layer contains no additive.

[B05] The light receiving element according to [B04] above, in which an average concentration of the additive contained in the transparent conductive material of the first layer is $5 \times 10^{16}$ $cm^{-3}$ to $1 \times 10^{18}$ $cm^{-3}$.

[B06] The light receiving element according to [B04] or [B05] above, in which when electrical resistivity of the first layer is represented by $R_1$, electrical resistivity of the second layer is represented by $R_2$, light transmittance of the first layer is represented by $TP_1$ within a wavelength range of 400 nm to 900 nm, and light transmittance of the first layer is represented by $TP_2$ within a wavelength range of 400 nm to 900 nm, $0.4 \le R_2/R_1 \le 1.0$ and $0.80 \le TP_2 \times TP_1 \le 1.0$ are satisfied.

[B07] The light receiving element according to any one of [B04] to [B06] above, in which average light transmittance of the transparent conductive material layer is 95% or more, average electrical resistivity of the transparent conductive material layer is $2 \times 10^{-6}$ $\Omega \cdot m$ or less, and a contact resistance value between the transparent conductive material layer and the surface recombination prevention layer or the contact layer is $1 \times 10^{-8}$ $\Omega \cdot m^2$.

[B08] The light receiving element according to any one of [B04] to [B07] above, in which when a thickness of the first layer is represented by $T_1$ and a thickness of the second layer is represented by $T_2$, $2 \le T_2/T_1 \le 70$ is satisfied.

[B09] The light receiving element according to [B08] above, in which $3 \le T_1$ (nm) $\le 60$ and $10 \le T_2$ (nm) $\le 350$ are satisfied.

[B10] The light receiving element according to any one of [B01] to [B03] above, in which the concentration of the additive contained in the transparent conductive material of the transparent conductive material layer is gradually decreased from the first surface to the second surface of the transparent conductive material layer.

[C01] <<Light Receiving Element, Second Feature>>

A light receiving element, including:

a transparent conductive material layer on which light is incident;

a surface recombination prevention layer composed of a first compound semiconductor;

a photoelectric conversion layer composed of a second compound semiconductor; and a compound semiconductor layer composed of a third compound semiconductor, further including:

a contact layer composed of a fourth compound semiconductor formed between the transparent conductive material layer and the surface recombination prevention layer, the surface recombination prevention layer having a thickness of 30 nm or less, and the contact layer having a thickness of 20 nm or less.

[C02] The light receiving element according to [C01] above, in which the contact layer comprises InGaAs, InP or InGaAsP, the surface recombination prevention layer comprises InP, InGaAsP or AlInAs, the photoelectric conversion layer comprises InGaAs, and the compound semiconductor layer comprises InGaAs, InP or InGaAsP.

[C03] The light receiving element according to [C02] above, in which a combination of (the compound semiconductor of the contact layer and the compound semiconductor of the surface recombination prevention layer) can include (InGaAs, InP), (InGaAs, InGaAsP), (InGaAs, AlInAs), (InP, InGaAsP), (InP, AlInAs), (InGaAsP, InP), (InGaAsP, AlInAs) or ($In_X$GaAsP, $In_Y$GaAsP)[where X>Y].

[C04] The light receiving element according to any one of [C01] to [C03] above, in which the first compound semiconductor is an n type compound semiconductor, the second compound semiconductor is an i type compound semiconductor, the third compound semiconductor is a p type compound semiconductor, and the fourth compound semiconductor is an n type compound semiconductor.

[C05] The light receiving element according to [C01] above, in which when a band gap of the first compound semiconductor is represented by $BG_1$, a band gap of the second compound semiconductor is represented by $BG_2$, a band gap of the third compound semiconductor is represented by $BG_3$, a band gap of the fourth compound semiconductor is represented by $BG_4$, $BG_1$, $BG_2$, $BG_3$ and $BG_4$ satisfy $BG_1 > BG_2$, $BG_3 > BG_2$ and $BG_1 > BG_4$.

[C06] The light receiving element according to any one of [C01] to [C04] above, in which the transparent conductive material layer comprises ITO, ITiO or NiO.

[D01] The light receiving element according to any one of [C01] to [C01] above, in which the transparent conductive material contains an additive composed of at least one metal selected from the group consisting of molybdenum, tungsten, chromium, ruthenium, titanium, nickel, zinc, iron and copper or a compound thereof, and a concentration of the additive contained in the transparent conductive material near an interface of the first surface of the transparent conductive material layer is higher than a concentration of the additive contained in the transparent conductive material near an interface of the second surface of the transparent conductive material layer.

[D02] The light receiving element according to [D01] above, in which the transparent conductive material include ITO, IZO, AZO, GZO, AlMgZnO, IGO, IGZO, IFO, ATO, FTO, $SnO_2$, ZnO, B doped ZnO, InSnZnO, NiO or ITiO.

[D03] The light receiving element according to [D01] or [D02] above, in which a supplemental electrode is formed on a second surface of the transparent conductive material layer.

[D04] The light receiving element according to any one of [D01] to [D03] above, in which the transparent conductive material layer has a laminated structure of a first layer and a second layer from a contact layer side, the transparent conductive material of the first layer contains an additive, and the transparent conductive material of the second layer contains no additive.

[D05] The light receiving element according to [D04] above, in which an average concentration of the additive contained in the transparent conductive material of the first layer is $5 \times 10^{16}$ $cm^{-3}$ to $1 \times 10^{18}$ $cm^{-3}$.

[D06] The light receiving element according to [D04] or [D05] above, in which when electrical resistivity of the first layer is represented by $R_1$, electrical resistivity of the second layer is represented by $R_2$, light transmittance of the first layer is represented by $TP_1$ within a wavelength range of 400 nm to 900 nm, and light transmittance of the first layer is represented by $TP_2$ within a wavelength range of 400 nm to 900 nm, $0.4 \leq R_2/R_1 \leq 1.0$ and $0.80 \leq TP_2 \times TP_1 \leq 1.0$ are satisfied.

[D07] The light receiving element according to any one of [D04] to [D06] above, in which average light transmittance of the transparent conductive material layer is 95% or more, average electrical resistivity of the transparent conductive material layer is $2 \times 10^{-6}$ $\Omega \cdot m$ or less, and a contact resistance value between the transparent conductive material layer and the surface recombination prevention layer or the contact layer is $1 \times 10^{-8}$ $\Omega \cdot m^2$.

[D08] The light receiving element according to any one of [D04] to [D07] above, in which when a thickness of the first layer is represented by $T_1$ and a thickness of the second layer is represented by $T_2$, $2 \leq T_2/T_1 \leq 70$ is satisfied.

[D09] The light receiving element according to [D08] above, in which $3 \leq T_1$ (nm) $\leq 60$ and $10 \leq T_2$ (nm) $\leq 350$ are satisfied.

[D10] The light receiving element according to any one of [D01] to [D03] above, in which the concentration of the additive contained in the transparent conductive material of the transparent conductive material layer is gradually decreased from the first surface to the second surface of the transparent conductive material layer.

[E01]<<Image Capturing Element, First Feature>>

An image capturing element including a light receiving element and a filter for passing light having a desirable wavelength disposed at a light incident side of the light receiving element, in which the light receiving element includes a surface recombination prevention layer composed of a first compound semiconductor on which light is incident;

a photoelectric conversion layer composed of a second compound semiconductor; and a compound semiconductor layer composed of a third compound semiconductor, the surface recombination prevention layer having a thickness of 30 nm or less.

[E02]<<Image Capturing Element, First Feature>>

An image capturing element including a light receiving element and a filter for passing light having a desirable wavelength disposed at a light incident side of the light receiving element, in which the light receiving element includes the light receiving element according to any one of [A01] to [D10] above.

[E03]<<Image Capturing Element, Second Feature>>

An image capturing element including a light receiving element and a filter for passing light having a desirable wavelength disposed at a light incident side of the light receiving element, in which the light receiving element includes a transparent conductive material layer on which light is incident;

a surface recombination prevention layer composed of a first compound semiconductor;

a photoelectric conversion layer composed of a second compound semiconductor; and a compound semiconductor layer composed of a third compound semiconductor, further including:

a contact layer composed of a fourth compound semiconductor formed between the transparent conductive material layer and the surface recombination prevention layer, the surface recombination prevention layer having a thickness of 30 nm or less, and the contact layer having a thickness of 20 nm or less.

[E04]<<Image Capturing Element, Second Feature>>

An image capturing element including a light receiving element and a filter for passing light having a desirable wavelength disposed at a light incident side of the light receiving element, in which the light receiving element includes the light receiving element according to any one of [A01] to [D10] above.

[F01]<<Image Capturing Apparatus, First Feature>>

An image capturing apparatus, including:

a plurality of image capturing elements including light receiving elements and filters for passing light having a desirable wavelength disposed at light incident sides of the light receiving elements, in which the light receiving element includes a surface recombination prevention layer composed of a first compound semiconductor on which light is incident;

a photoelectric conversion layer composed of a second compound semiconductor; and a compound semiconductor layer composed of a third compound semiconductor, the surface recombination prevention layer having a thickness of 30 nm or less.

[F02]<<Image Capturing Apparatus, First Feature>>

An image capturing apparatus including a plurality of image capturing elements including light receiving elements and filters for passing light having a desirable wavelength disposed at a light incident side of the light receiving element, in which the light receiving element includes the light receiving element according to any one of [A01] to [D10] above.

[F03]<<Image Capturing Apparatus, Second Feature>>

An image capturing apparatus, including:

a plurality of image capturing elements including light receiving elements and filters for passing light having a desirable wavelength disposed at light incident sides of the light receiving elements, in which the light receiving element includes a transparent conductive material layer on which light is incident;

a surface recombination prevention layer composed of a first compound semiconductor;

a photoelectric conversion layer composed of a second compound semiconductor; and a compound semiconductor layer composed of a third compound semiconductor, further including:

a contact layer composed of a fourth compound semiconductor formed between the transparent conductive material layer and the surface recombination prevention layer, the surface recombination prevention layer having a thickness of 30 nm or less, and the contact layer having a thickness of 20 nm or less.

[F04]<<Image Capturing Apparatus, Second Feature>>

An image capturing apparatus including a plurality of image capturing elements including light receiving elements and filters for passing light having a desirable wavelength disposed at a light incident side of the light receiving element, in which the light receiving element includes the light receiving element according to any one of [A01] to [D10] above.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An image capturing apparatus, comprising
a plurality of image capturing elements including
a light receiving element and a filter for passing light having a desirable wavelength,
wherein the filter is disposed at a light incident side of the light receiving element,
a silicon semiconductor substrate having a circuit for driving the light receiving element,
wherein the light receiving element has a laminated structure and includes
a transparent conductive material layer;
a surface recombination prevention layer including a first compound semiconductor, wherein the surface recombination prevention layer has a thickness of 10 nm or more and 30 nm or less;
a photoelectric conversion layer including a second compound semiconductor;
a compound semiconductor layer including a third compound semiconductor, wherein the compound semiconductor layer is in contact with the photoelectric conversion layer, and
a second electrode being in contact with the compound semiconductor layer, and
wherein the photo photoelectric conversion layer is shared by adjacent light receiving elements, and wherein the compound semiconductor layer and an insulating layer are provided in a same layer, and the compound semiconductor layer is separated by the insulating layer, and wherein the second electrode is connected to the circuit in the silicon semiconductor substrate.

2. The image capturing apparatus according to claim 1, wherein the surface recombination prevention layer comprises InP, InGaAsP or AlInAs, the photoelectric conversion layer comprises InGaAs, and the compound semiconductor layer comprises InP, InGaAsP or AlInAs.

3. The image capturing apparatus according to claim 1, wherein the first compound semiconductor is an n type compound semiconductor, the second compound semiconductor is an i type compound semiconductor, and the third compound semiconductor is a p type compound semiconductor.

4. The image capturing apparatus according to claim 1, wherein when a band gap of the first compound semiconductor is represented by BG1, a band gap of the second compound semiconductor is represented by BG2, and a band gap of the third compound semiconductor is represented by BG3, where BG1, BG2 and BG3 satisfy BG1>BG2 and BG3>BG2.

5. The image capturing apparatus according to claim 1, wherein the transparent conductive material layer comprises ITO, ITiO or NiO.

6. The image capturing apparatus according to claim 1 further including: a contact layer including a fourth compound semiconductor formed between the transparent conductive material layer and the surface recombination prevention layer, and the contact layer having a thickness of 20 nm or less.

7. The image capturing apparatus according to claim 6, wherein the contact layer comprises InGaAs, InP or InGaAsP, the surface recombination prevention layer comprises InP, InGaAsP or AlInAs, the photoelectric conversion layer comprises InGaAs, and the compound semiconductor layer comprises InGaAs, InP or InGaAsP.

8. The image capturing apparatus according to claim 7, wherein a combination of (the compound semiconductor of the contact layer and the compound semiconductor of the surface recombination prevention layer) includes (InGaAs, InP), (InGaAs, InGaAsP), (InGaAs, AlInAs), (InP, InGaAsP), (InP, AlInAs), (InGaAsP, InP), (InGaAsP, AlInAs) or ($In_X$GaAsP, $In_Y$GaAsP), where X>Y.

9. The image capturing apparatus according to claim 6, wherein the first compound semiconductor is an n type compound semiconductor, the second compound semiconductor is an i type compound semiconductor, the third compound semiconductor is a p type compound semiconductor, and the fourth compound semiconductor is an n type compound semiconductor.

10. The image capturing apparatus according to claim 6, wherein when a band gap of the first compound semiconductor is represented by BG1, a band gap of the second compound semiconductor is represented by BG2, a band gap of the third compound semiconductor is represented by BG3, and a band gap of the fourth compound semiconductor is represented by BG4, where BG1, BG2, BG3 and BG4 satisfy BG1>BG2, BG3>BG2 and BG1>BG4.

* * * * *